US008268456B2

(12) United States Patent
Koyama et al.

(10) Patent No.: US 8,268,456 B2
(45) Date of Patent: Sep. 18, 2012

(54) ORGANIC LIGHT-EMITTING DEVICE USING A COMPOUND HAVING A CARRIER TRANSPORT PROPERTY AND A PHOSPHORESCENT PROPERTY

(75) Inventors: Tamami Koyama, Chiba (JP); Takeshi Igarashi, Chiba (JP)

(73) Assignee: Showa Denko K.K., Tokyo (JP)

( * ) Notice: Subject to any disclaimer, the term of this patent is extended or adjusted under 35 U.S.C. 154(b) by 969 days.

(21) Appl. No.: 12/281,544

(22) PCT Filed: Mar. 26, 2007

(86) PCT No.: PCT/JP2007/057330

§ 371 (c)(1),
(2), (4) Date: Sep. 3, 2008

(87) PCT Pub. No.: WO2007/119629

PCT Pub. Date: Oct. 25, 2007

(65) Prior Publication Data

US 2009/0058286 A1 Mar. 5, 2009

(30) Foreign Application Priority Data

Mar. 27, 2006 (JP) ................................ 2006-085639

(51) Int. Cl.
*H01L 51/50* (2006.01)

(52) U.S. Cl. ........ 428/690; 428/917; 313/504; 313/505; 313/506; 257/40; 257/E51.05; 257/E51.032

(58) Field of Classification Search ................. 428/690, 428/917; 313/504, 505, 506; 257/40, E51.05, 257/E51.032

See application file for complete search history.

(56) References Cited

U.S. PATENT DOCUMENTS

| | | | | |
|---|---|---|---|---|
| 6,288,700 | B1 * | 9/2001 | Mori | 345/102 |
| 7,250,226 | B2 | 7/2007 | Tokito et al. | |
| 7,745,017 | B2 | 6/2010 | Nakamura et al. | |
| 2003/0059647 | A1 | 3/2003 | Thompson et al. | |
| 2003/0186080 | A1 | 10/2003 | Kamatani et al. | |
| 2003/0189216 | A1 | 10/2003 | Kamatani et al. | |
| 2004/0247934 | A1 * | 12/2004 | Takeuchi et al. | 428/690 |
| 2004/0260047 | A1 | 12/2004 | Chen et al. | |

(Continued)

FOREIGN PATENT DOCUMENTS

EP 1 245 659 A1 10/2002

(Continued)

OTHER PUBLICATIONS

Suzuki et. al., Highly efficient polymer light-emitting devices . . . , 2005, Applied Physics Letters, vol. 86, pp. 103507-1 to 103507-3.*

(Continued)

*Primary Examiner* — Jennifer Chriss
*Assistant Examiner* — Gregory Clark
(74) *Attorney, Agent, or Firm* — Sughrue Mion, PLLC

(57) ABSTRACT

Disclosed is an organic light-emitting device which contains one or more organic layers sandwiched between an anode and a cathode, wherein at least one of the organic layers is a light-emitting layer including a polymer compound (I), the polymer compound (I) containing structural units derived from a hole transport or electron transport and phosphorescent polymerizable compound (a1) and structural units derived from a polymerizable compound (b) capable of transporting an oppositely charged carrier, the polymerizable compound (a1) being selected from formulae (E1-1) to (E1-39) as defined herein.

18 Claims, 1 Drawing Sheet

U.S. PATENT DOCUMENTS

| | | | | |
|---|---|---|---|---|
| 2005/0129980 | A1* | 6/2005 | Suzuki et al. | 428/690 |
| 2005/0156832 | A1* | 7/2005 | Ono | 345/76 |
| 2005/0238917 | A1* | 10/2005 | Yasuda et al. | 428/690 |
| 2005/0253510 | A1* | 11/2005 | Nasu et al. | 313/509 |
| 2006/0066224 | A1* | 3/2006 | Ito | 313/504 |
| 2008/0061686 | A1* | 3/2008 | Liu et al. | 313/506 |

FOREIGN PATENT DOCUMENTS

| | | | |
|---|---|---|---|
| JP | 2002-293830 | A | 10/2002 |
| JP | 2003-73479 | A | 3/2003 |
| JP | 2003-342325 | A | 12/2003 |
| JP | 2004-018787 | A | 1/2004 |
| JP | 2006-013222 | A | 1/2006 |
| JP | 2006-237306 | A | 9/2006 |
| WO | 2005/086628 | A2 | 9/2005 |
| WO | 2006/001150 | A1 | 1/2006 |

OTHER PUBLICATIONS

Japanese Office Action dated Aug. 8, 2011, issued in counterpart Japanese Patent Application No. 2006-085639.

Chinese Office Action dated Mar. 7, 2012 issued in Chinese Patent Application No. 200780010736.5.

Shizuo Tokito, et al.; "High-efficiency phosphorescent polymer light-emitting devices"; Organic Electronics; vol. 4; Issues 2-3; Sep. 2003; pp. 105-111.

* cited by examiner

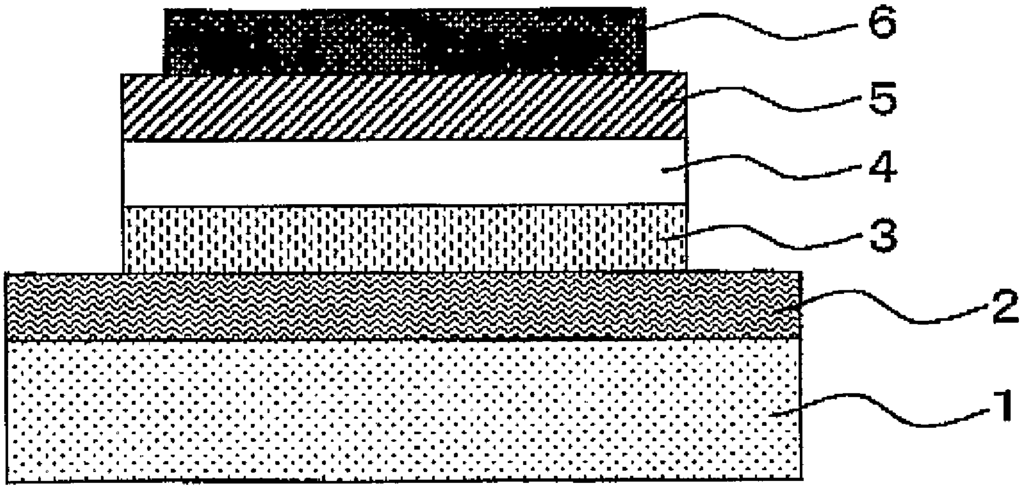
6
5
4
3
2
1

ORGANIC LIGHT-EMITTING DEVICE USING A COMPOUND HAVING A CARRIER TRANSPORT PROPERTY AND A PHOSPHORESCENT PROPERTY

TECHNICAL FIELD

The present invention relates to an organic light-emitting device obtained by a compound having a carrier transport property and a phosphorescent property. In more detail, this invention relates to an organic light-emitting device achieving high luminous efficiency and excellent durability by using a compound that has a carrier transport property and a phosphorescent property and contains a specific substituent.

BACKGROUND ART

As an organic light-emitting device, a device with a multi-layered structure having a light-emitting layer containing a phosphorescent low-molecular weight compound between a hole transport layer and an electron transport layer has been known.

On the other hand, a phosphorescent polymer compound that is obtained by copolymerizing a polymerizable compound having a phosphorescent property, a polymerizable compound having a hole transport property, and a polymerizable compound having an electron transport property has also been developed. Such phosphorescent polymer compound has a merit of obtaining an organic light-emitting device by merely providing one layer comprising this polymer compound, since it has the functions of the hole transport property and the electron transport property as well as the phosphorescent property within a single compound.

In the past, for the synthesis of the polymer compound, polymerizable compounds have been used, wherein polymerizable substituents were introduced into each of publicly known phosphorescent low-molecular weight compounds, low-molecular weight compounds having hole transport property, and low-molecular weight compounds having electron transport property (see patent documents 1 and 2).

In this manner, however, when a phosphorescent low-molecular weight compound that is preferably used for the multi-layered devices is copolymerized with a polymerizable compound having a hole transport property and a polymerizable compound having an electron transport property, the device having a tendency to deteriorate more easily than the multi-layered devices may be obtained in some cases.

Also, in the polymer compound described above, it was difficult to attain high luminous efficiency by efficiently generating excitons on the structural unit having the phosphorescent property. This is because, in a polymer compound having all functions in a single layer, it is necessary to combine the energy levels of each compound having the phosphorescent property, the hole transport property and the electron transport property more strictly than the case where the multi-layered device was prepared, thus the selection of each compound is very difficult.

Further, it has been known that when a polymer compound containing a structural unit having the phosphorescent property in high concentration was used in order to improve the luminous efficiency, the concentration quenching took place on the contrary, and as a result, high luminous efficiency was not attained.

[Patent Document 1] Japanese Patent Laid-Open Publication No. 2002-293830

[Patent Document 2] Japanese Patent Laid-Open Publication No. 2003-73479

DISCLOSURE OF THE INVENTION

An object of the present invention is to provide an organic light-emitting device with high luminous efficiency and excellent durability.

The present inventors, as a result of extensive investigations for solving the above mentioned problem, have found that an organic light-emitting device with high luminous efficiency and excellent durability can be obtained by using a compound having a specific substituent as well as a carrier transport property and a phosphorescent property, thus accomplished the present invention.

Namely, the present invention can be summarized as follows.

[1] An organic light-emitting device which contains one or more organic layers sandwiched between an anode and a cathode, wherein at least one of the organic layers is a light-emitting layer comprising a polymer compound (I), the polymer compound (I) comprising structural units derived from a hole transport or electron transport and phosphorescent polymerizable compound (a1) and structural units derived from a polymerizable compound (b) capable of transporting an oppositely charged carrier, the polymerizable compound (a1) being selected from the group consisting of the following formulae (E1-1) to (E1-39):

E1-1

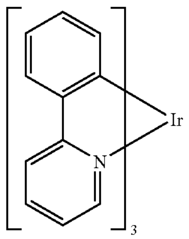

E1-2

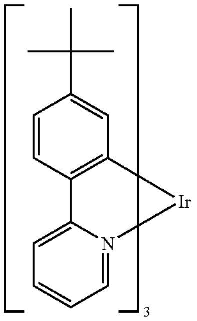

E1-3

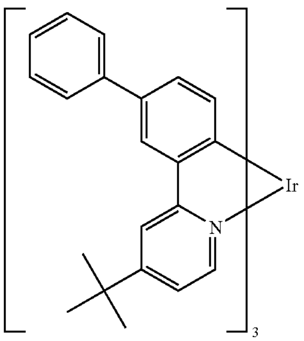

-continued
E1-4
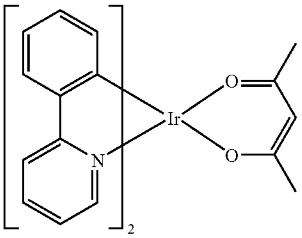
E1-5
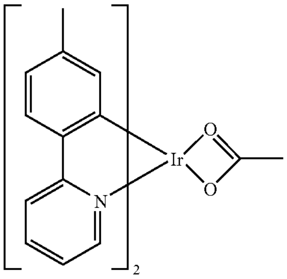
E1-6
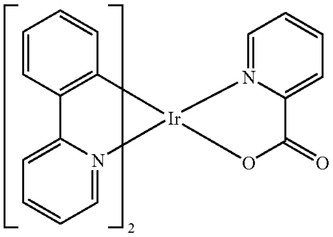
E1-7
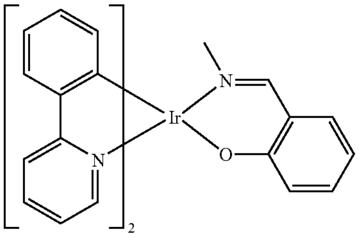
E1-8
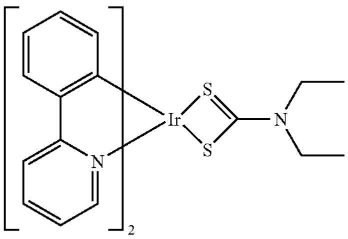
E1-9
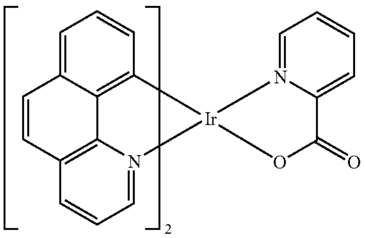
-continued
E1-10
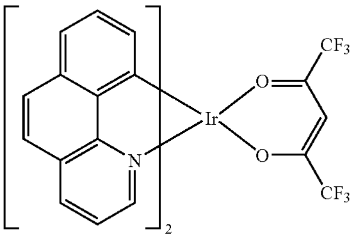
E1-11
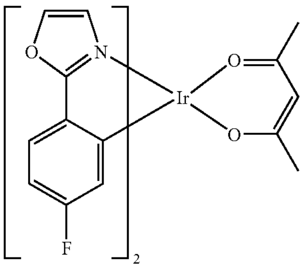
E1-12
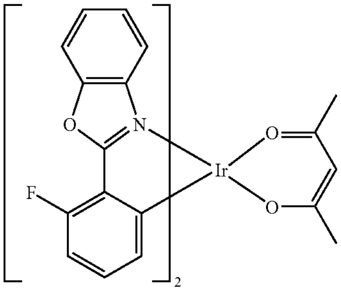
E1-13
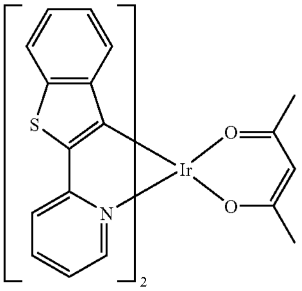
E1-14
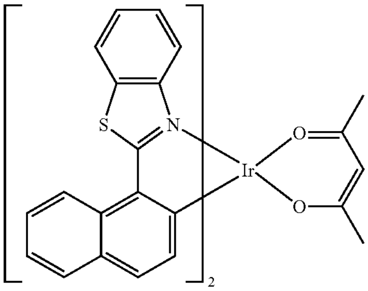

-continued
E1-15
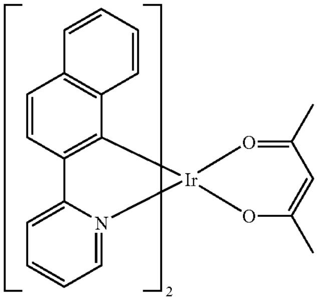
E1-16
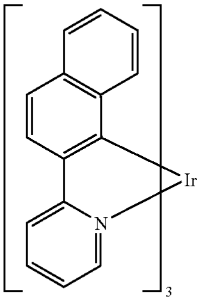
E1-17
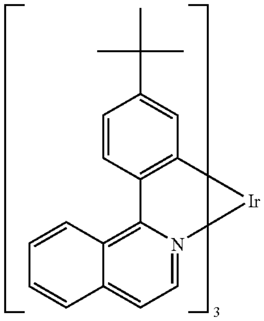
E1-18
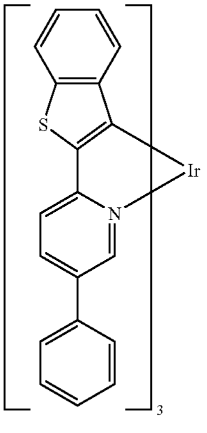
-continued
E1-19
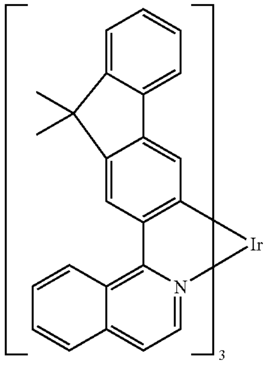
E1-20
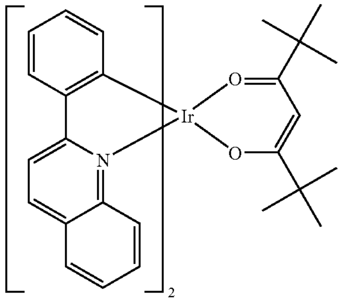
E1-21
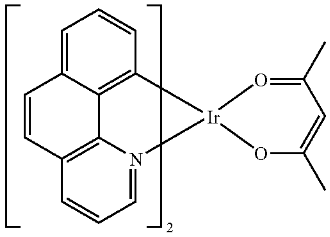
E1-22
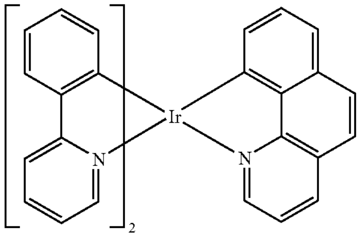
E1-23
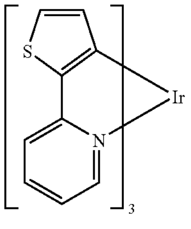

-continued
E1-24
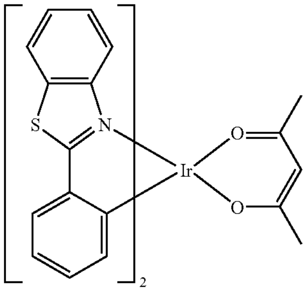
E1-25
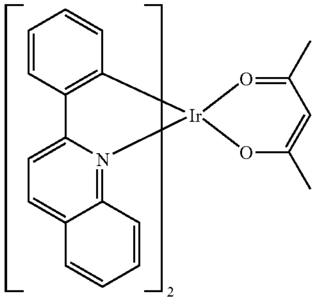
E1-26
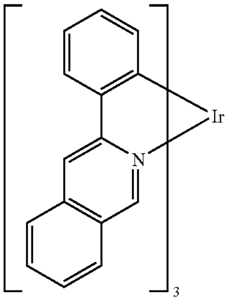
E1-27
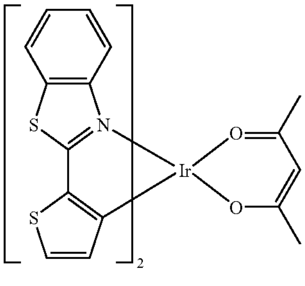
E1-28
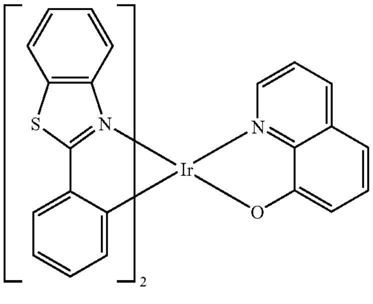
-continued
E1-29
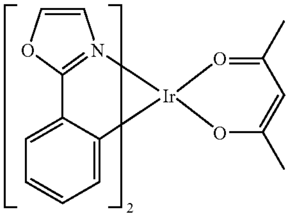
E1-30
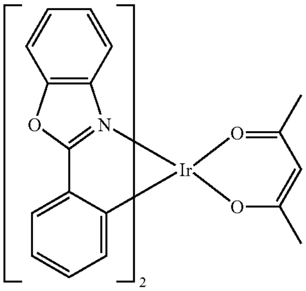
E1-31
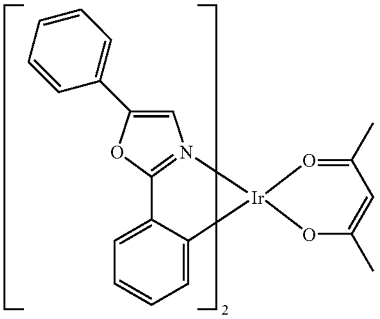
E1-32
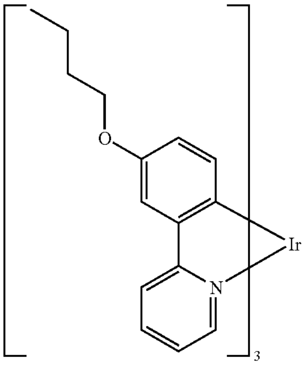
E1-33
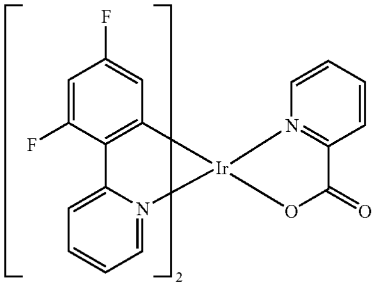

-continued

E1-34

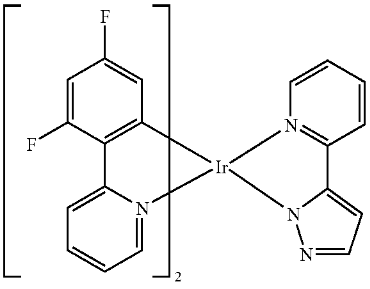

E1-35

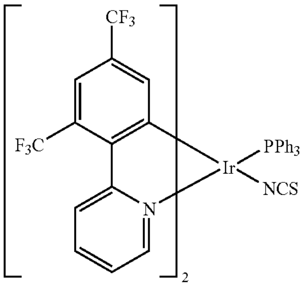

E1-36

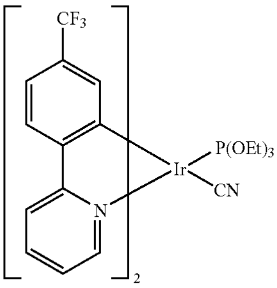

E1-37

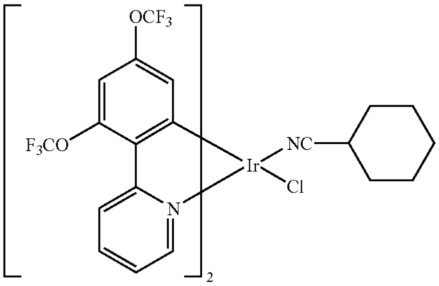

E1-38

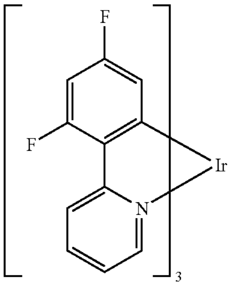

-continued

E1-39

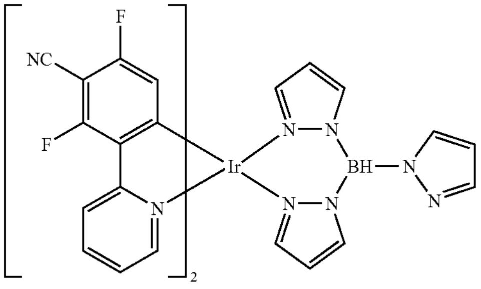

wherein at least one of the hydrogen atoms in the formula (E1-1) is replaced by a substituent selected from the group consisting of a halogen atom, a cyano group, an alkyl group having 1 to 10 carbon atoms, an aryl group having 6 to 10 carbon atoms, an amino group optionally substituted with an alkyl group having 1 to 10 carbon atoms, an alkoxy group having 1 to 10 carbon atoms, and a silyl group, and one of the hydrogen atoms is replaced by a polymerizable substituent represented by general formula (H1), (H1)

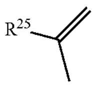

wherein $R^{25}$ represents a hydrogen atom or a linear alkyl group having 1 to 5 carbon atoms; and these substitutions apply to the hydrogen atoms in the formulae (E1-2) to (E1-39).

[2] The organic light-emitting device according to [1], wherein the polymerizable compound (a1) is a hole transport and phosphorescent compound and the polymerizable compound (b) is an electron transport compound.

[3] The organic light-emitting device according to [1], wherein the polymerizable compound (a1) is an electron transport and phosphorescent compound and the polymerizable compound (b) is a hole transport compound.

[4] The organic light-emitting device according to [2], wherein the polymerizable compound (a1) is represented by the formula (E1-1).

[5] An organic light-emitting device which contains one or more organic layers sandwiched between an anode and a cathode, wherein at least one layer of the organic layers is a light-emitting layer comprising a compound (a2) being a hole transport or electron transport and phosphorescent compound and a polymer compound (II) comprising structural units derived from a polymerizable compound (b) capable of transporting an oppositely charged carrier, the compound (a2) being selected from the group consisting of the following formulae (E2-1)-(E2-39):

E2-1
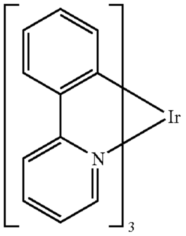
E2-2
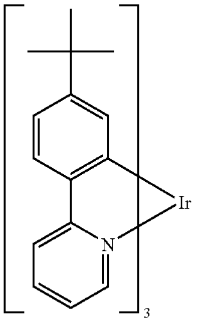
E2-3
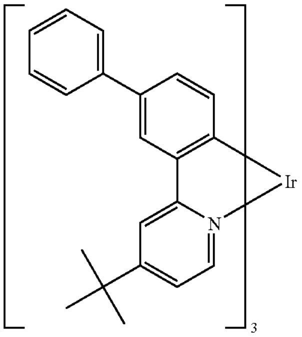
E2-4
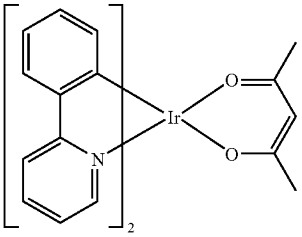
E2-5
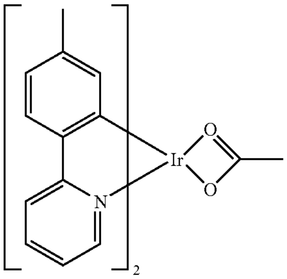
-continued
E2-6
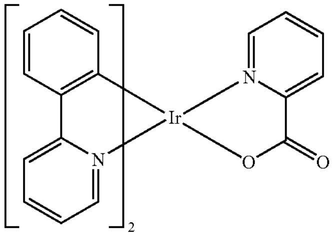
E2-7
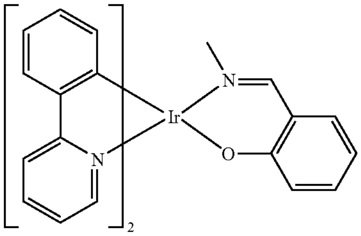
E2-8
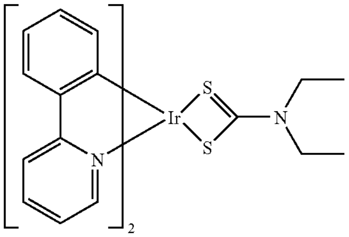
E2-9
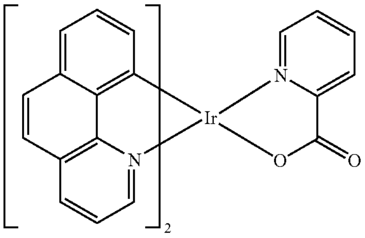
E2-10
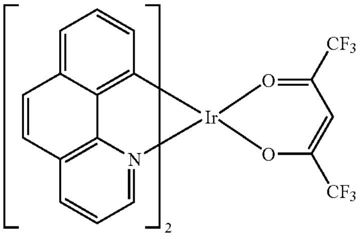
E2-11
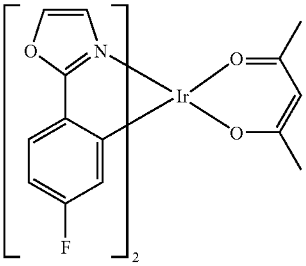

-continued
E2-12
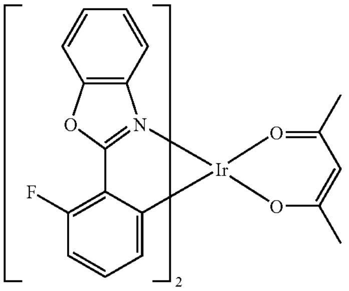
E2-13
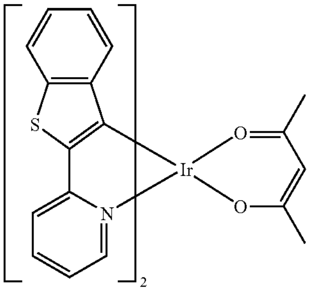
E2-14
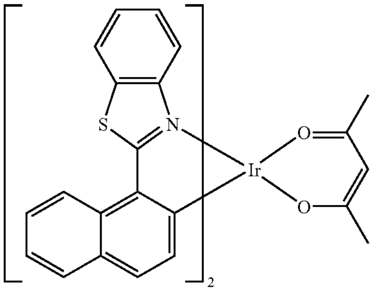
E2-15
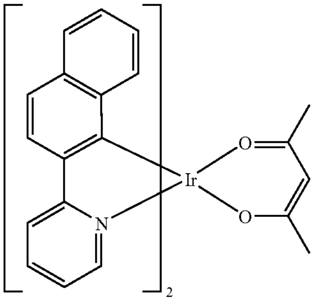
E2-16
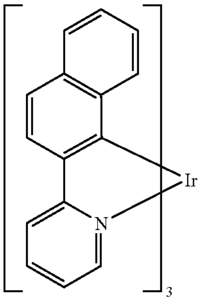
-continued
E2-17
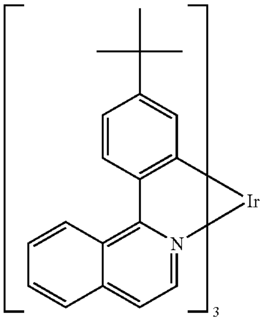
E2-18
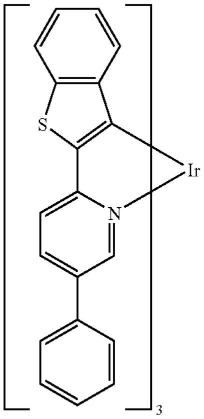
E2-19
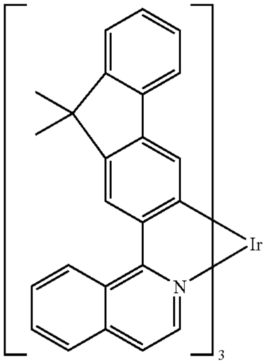
E2-20
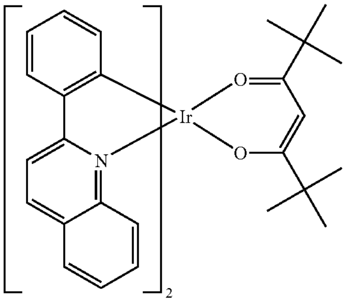

-continued
E2-21
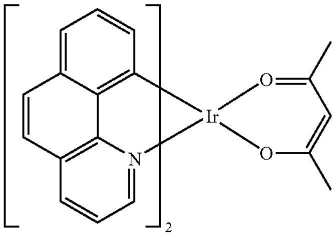
E2-22
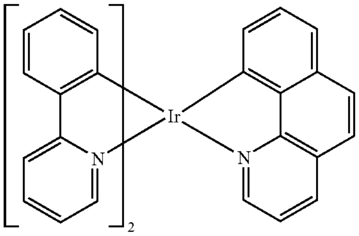
E2-23
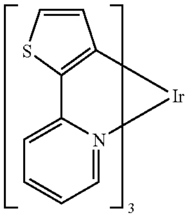
E2-24
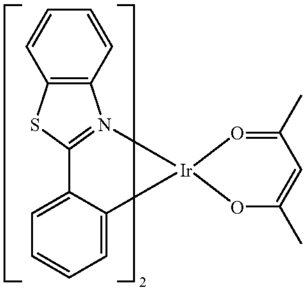
E2-25
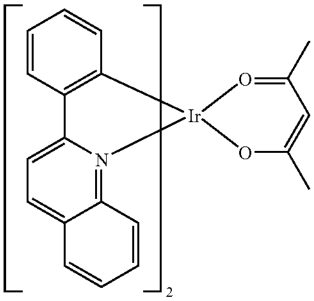
E2-26
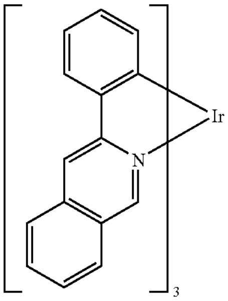
-continued
E2-27
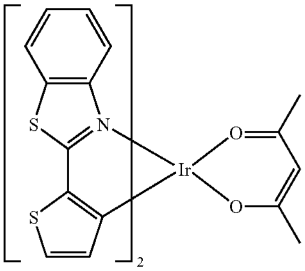
E2-28
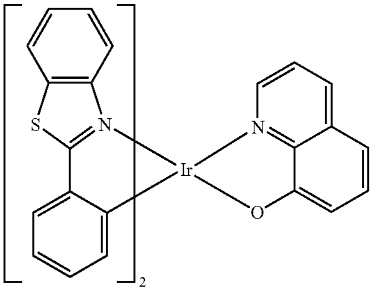
E2-29
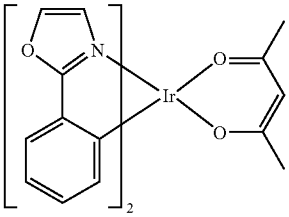
E2-30
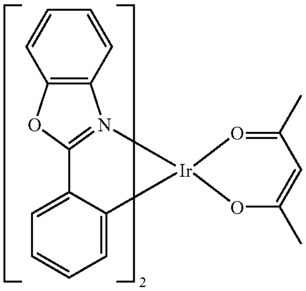
E2-31
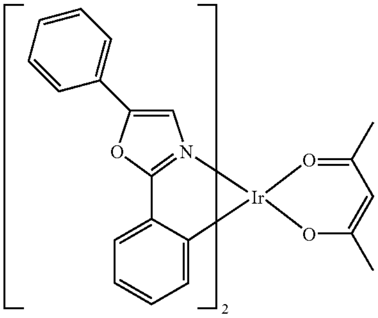

-continued

E2-32

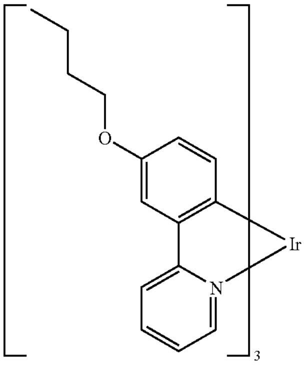

E2-33

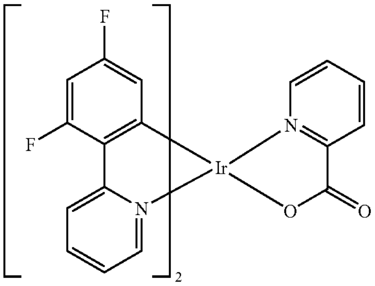

E2-34

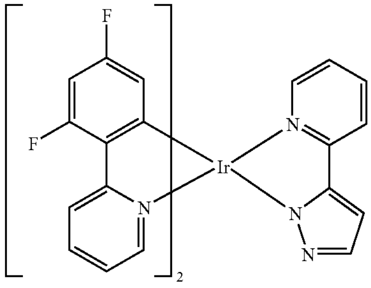

E2-35

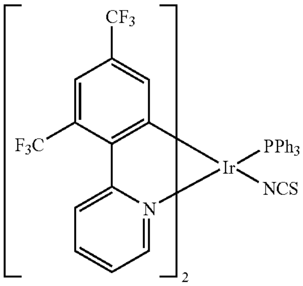

E2-36

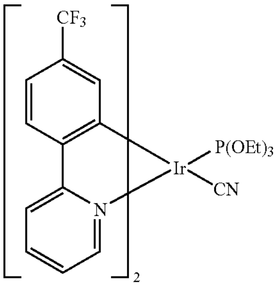

-continued

E2-37

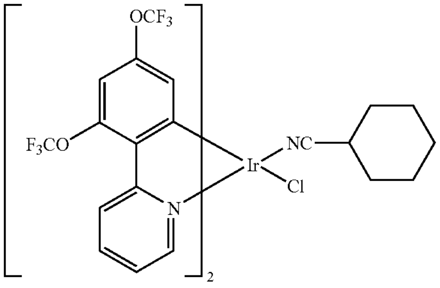

E2-38

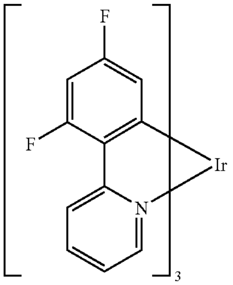

E2-39

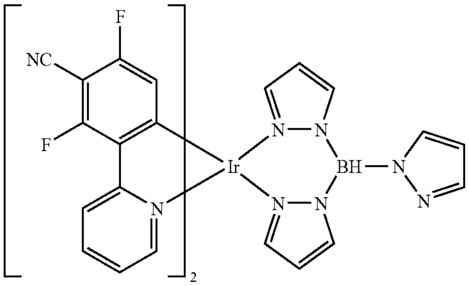

wherein at least one of the hydrogen atoms in the formula (E2-1) is replaced by a substituent selected from the group consisting of a halogen atom, a cyano group, an alkyl group having 1 to 10 carbon atoms, an aryl group having 6 to 10 carbon atoms, an amino group optionally substituted with an alkyl group having 1 to 10 carbon atoms, an alkoxy group having 1 to 10 carbon atoms, and a silyl group; and these substitutions apply to the hydrogen atoms in the formulae (E2-2) to (E2-39).

[6] The organic light-emitting device according to [5], wherein the compound (a2) is a hole transport and phosphorescent compound, and the polymerizable compound (b) is an electron transport compound.

[7] The organic light-emitting device according to [5], wherein the compound (a2) is an electron transport and phosphorescent compound, and the polymerizable compound (b) is a hole transport compound.

[8] The organic light-emitting device according to [6], wherein the compound (a2) is represented by the formula (E2-1).

[9] The organic light-emitting device according to any of [1] to [4], wherein the polymer compound (I) contains the structural units derived from the polymerizable compound (a1) in an amount of 3 to 60 wt % based on the total structural units.

[10] The organic light-emitting device according to any of [5] to [8], wherein the light-emitting layer contains the compound (a2) in an amount of 3 to 60 wt % based on the total amount of the compound (a2) and the polymer compound (II).

[11] The organic light-emitting device according to any of [1] to [4] and [9], wherein the light-emitting layer contains a phosphorescent compound (d) which emits light at lower energy than the polymerizable compound (a1).

[12] The organic light-emitting device according to any of [5] to [8] and [10], wherein the light-emitting layer contains a phosphorescent compound (d) which emits light at lower energy than the compound (a2).

[13] An image display device, wherein the organic light-emitting device as described in any of [1] to [12] is used.

[14] An surface-emitting light source, wherein the organic light-emitting device as described in any of [1] to [12] is used.

[15] A back-light for an image display device, wherein the organic light-emitting device as described in any of [1] to [12] is used.

[16] An illuminating device, wherein the organic light-emitting device as described in any of [1] to [12] is used.

[17] An interior, wherein the organic light-emitting device as described in any of [1] to [12] is used.

[18] An exterior, wherein the organic light-emitting device as described in any of [1] to [12] is used.

EFFECTS OF THE INVENTION

According to the present invention, an organic light-emitting device with high luminous efficiency and excellent durability can be obtained since a compound having a carrier transport property and a phosphorescent property and a specific substituent is used.

BRIEF DESCRIPTION OF THE DRAWING

FIG. 1 shows a cross-sectional view of an example of the organic light-emitting device according to the present invention.

1: transparent substrate
2: anode
3: hole transport layer
4: light-emitting layer
5: electron transport layer
6: cathode

BEST MODES FOR CARRYING OUT THE INVENTION

In the following, the present invention is specifically explained.

1. Configuration of the Light-Emitting Device

An organic light-emitting device of the present invention contains at least one organic layer sandwiched between an anode and a cathode, wherein at least one layer of the organic layers contains a light-emitting layer.

One example of the configuration of the organic light-emitting device is illustrated in FIG. 1, though the configuration of the device is not restricted to it. In FIG. 1, between an anode (2) and a cathode (6) provided on a transparent substrate (1), a hole transport layer (3), a light-emitting layer (4), and an electron transport layer (5) are provided in this order.

In the organic light-emitting device, for example, either 1) a hole transport layer/a light-emitting layer or 2) a light-emitting layer/an electron transport layer, or 3) only a light-emitting layer may be provided between the anode (2) and the cathode (6). Also, more than two light-emitting layers may be stacked, an anode buffer layer may be provided between the anode (2) and the hole transport layer (3), or a hole blocking layer may be provided between the light-emitting layer (4) and the electron transport layer (5). Further, in addition, there may be provided 4) a layer containing a compound having a hole transport property, a compound having a light emitting property, and a compound having an electron transport property, 5) a layer containing a compound having a hole transport property and a compound having a light-emitting property, 6) a layer containing a compound having a light-emitting property and a compound having an electron transport property, or 7) a layer containing a compound having both a hole transport property and an electron transport property and a compound having a light-emitting property.

Each of the layers may be formed by mixing polymer materials as binders. Examples of such polymer materials include Poly(methylmethacrylate), polycarbonate, polyesters, polysulfones, poly(phenylene oxide) and the like.

Meanwhile, in this specification, at least one compound selected from the group consisting of a compound having an electron transport property, a compound having a hole transport property, and a compound having a light-emitting property may be also referred to as an organic electroluminescence compound (also organic EL compound in this specification), and a layer comprising the compound may be also referred to as an organic EL compound layer. Further, a compound having a hole transport property, a compound having an electron transport property, and a compound having both a hole transport property and an electron transport property may be also referred to as a compound having carrier transport property.

2. Light-Emitting Layer

The light-emitting layer used in the present invention is [A] a light-emitting layer containing a polymer compound (I); or [B] a light-emitting layer containing a compound (a2) and a polymer compound (II), and may be [C] a light-emitting layer containing the polymer compound (I) and a compound (d); or [D] a light-emitting layer that contains the compound (a2), the polymer compound (II) and the compound (d).

<Light-Emitting Layer [A]>

The light-emitting layer [A] comprises the polymer compound (I) that contains a structural unit derived from the polymerizable compound (a1) and a structural unit derived from the polymerizable compound (b). The polymer compound (I) is obtained by copolymerizing the polymerizable compound (a1) and the polymerizable compound (b).

The polymerizable compound (a1) has one carrier transport property either of a hole transport property or an electron transport property and a phosphorescent property, and is selected from the group consisting of the formulae (E1-1) to (E1-39). That is, the polymerizable compound (a1) is a hole transport or electron transport and phosphorescent compound. The polymerizable compound (a1) may be used solely or in a combination of two kinds or more if they have the same carrier transport property.

In the formula (E1-1), at least one of the hydrogen atoms represents a substituent selected from the group consisting of a halogen atom, a cyano group, an alkyl group having 1 to 10 carbon atoms, an aryl group having 6 to 10 carbon atoms, an amino group optionally substituted with an alkyl group having 1 to 10 carbon atoms, an alkoxy group having 1-10 carbon atoms, and a silyl group.

Examples of such halogen atom include fluorine, chlorine, bromine, and iodine.

Examples of such alkyl group having 1 to 10 carbon atoms include methyl, ethyl, propyl, isopropyl, butyl, isobutyl, t-butyl, amyl, hexyl, octyl, and decyl.

Examples of such aryl group having 6 to 10 carbon atoms include phenyl, tolyl, xylyl, mesityl, and naphtyl.

Examples of such amino group optionally substituted with an alkyl group having 1 to 10 carbon atoms include amino, dimethylamino, diethylamino, and dibutylamino.

Examples of such alkoxy group having 1 to 10 carbon atoms include methoxy, ethoxy, propoxy, isopropoxy, butoxy, isobutoxy, t-butoxy, hexyloxy, 2-ethylhexyloxy, and decyloxy.

Examples of such silyl group include trimethylsilyl, triethylsilyl, and t-butyldimethylsilyl.

Among these groups, fluorine atom, an alkyl group having 1 to 4 carbon atoms, phenyl group, tolyl group, dimethylamino group, and an alkoxy group having 1 to 4 carbon atoms are preferable, and fluorine atom, t-butyl group, dimethylamino group, and methoxy group are more preferable.

In the formula (E1-1), one of the hydrogen atoms represents a polymerizable substituent represented by the formula (H1). In this formula, $R^{25}$ represents a hydrogen atom or a linear alkyl group having 1 to 5 carbon atoms. Among them, methyl, ethyl, and propyl groups are preferable.

The polymerizable substituent may be a substituent such as the one that is bonded to an iridium complex through an organic group composed of only hydrocarbons having 1 to 20 carbon atoms without containing heteroatoms.

As the polymerizable substituent, specifically, the substituents represented by the following general formulae (A1) to (A11) are preferably used.

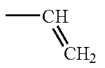

(A1)

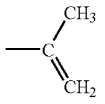

(A2)

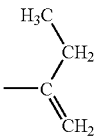

(A3)

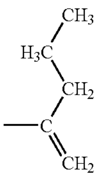

(A4)

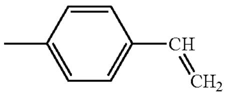

(A5)

-continued

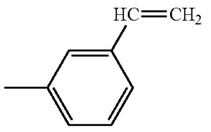

(A6)

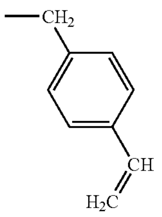

(A7)

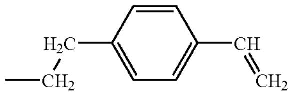

(A8)

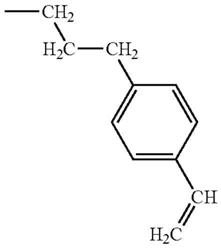

(A9)

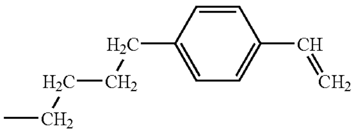

(A10)

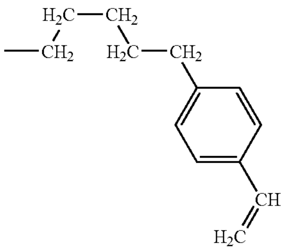

(A11)

These substitutions apply to the hydrogen atoms in the formulae (E1-2) to (E1-39).

The polymerizable compound (b) has one carrier transport property either of a hole transport property or an electron transport property. That is, the polymerizable compound (b)

is a hole transport or electron transport compound. The polymerizable compound (b) may not be restricted as long as it contains a polymerizable substituent, and a publicly known compound having the carrier transport property are used. The polymerizable compound (b) may be used solely or in a combination of two kinds or more if they have the same carrier transport property.

The aforementioned polymerizable substituents have the same meanings as the polymerizable substituents in the polymerizable compound represented by the formula (E1-1), and so is the preferred range.

As the polymerizable compound (b) having the hole transport property, a compound represented by the following formulae (F1) to (F9) is preferably used.

F1

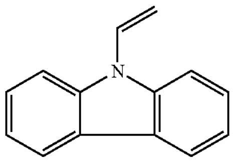

F2

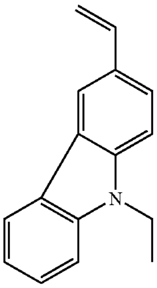

F3

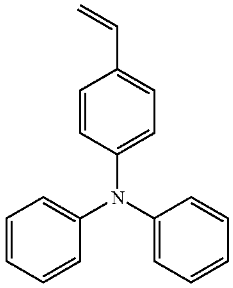

-continued

F4

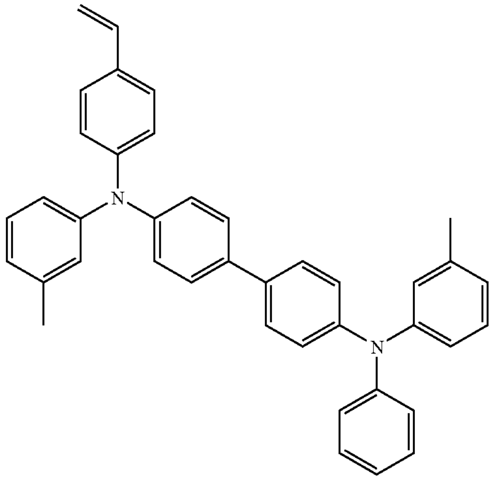

F5

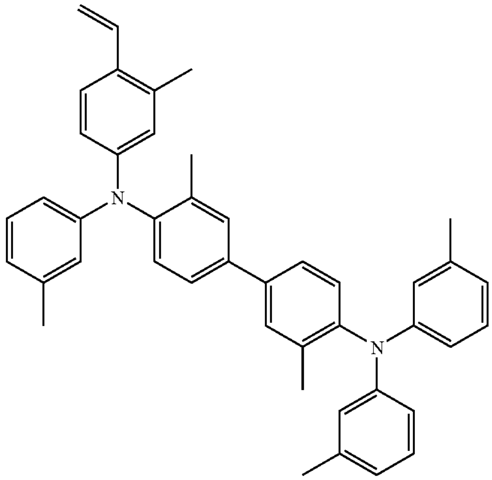

F6

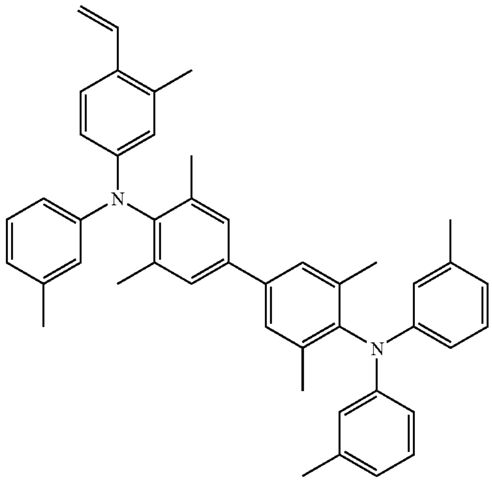

-continued
F7
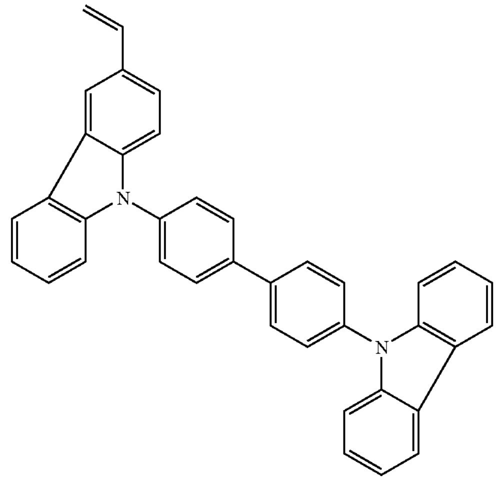
F8
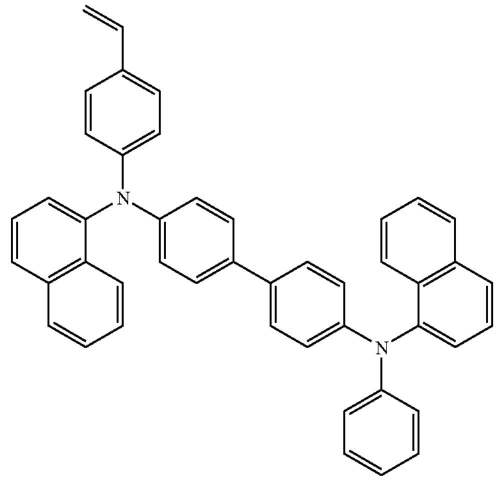
F9
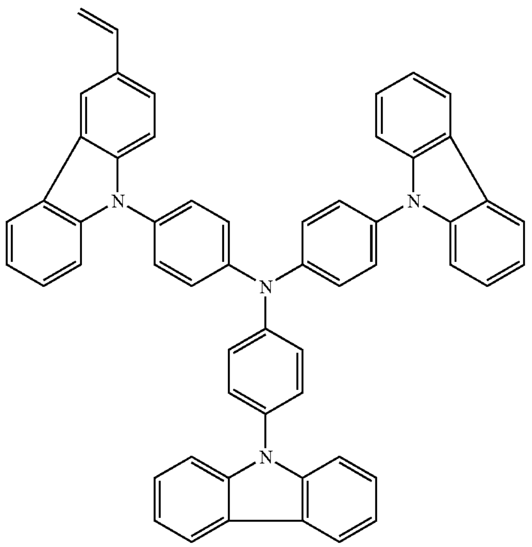
As the polymerizable compound (b) having the electron transport property, a compound represented by the following formulae (G1) to (G9) is preferably used.
(G1)
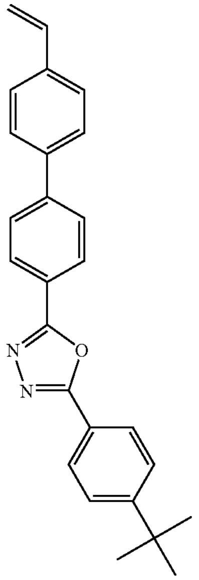
(G2)
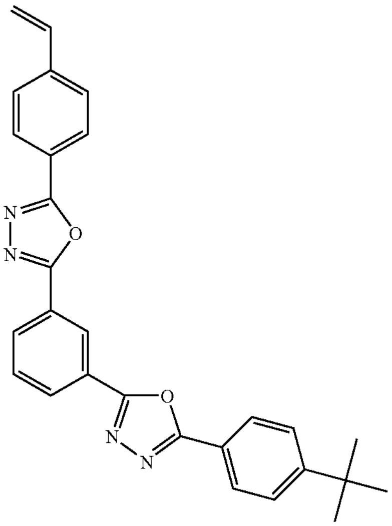

-continued
(G3)
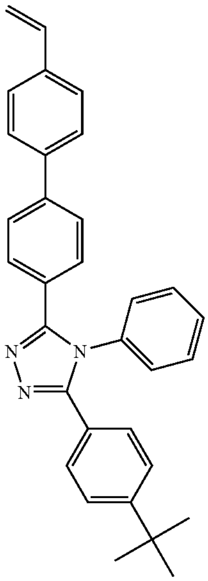
(G4)
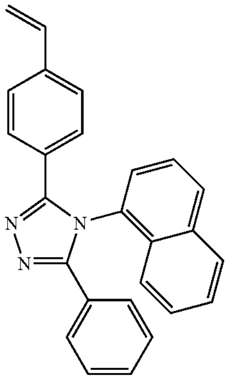
(G5)
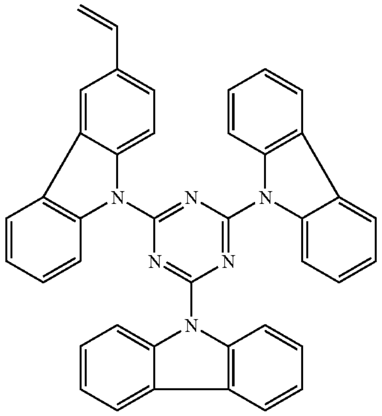
-continued
(G6)
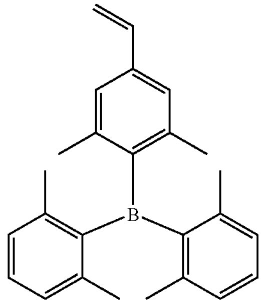
(G7)
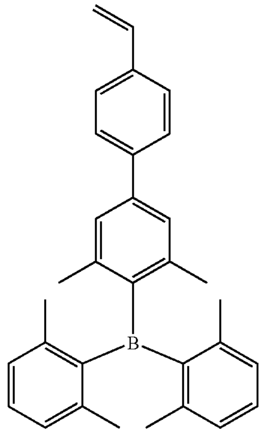
(G8)
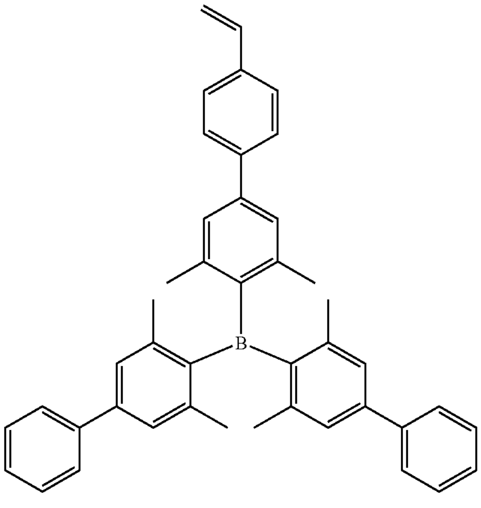

-continued (G9)

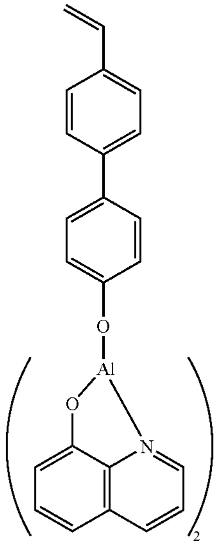

While a polymerizable substituent is represented by the formula (A1) in the formulae (F1) to (F9) and (G1) to (G9), a polymerizable substituent represented by the aforementioned formula (H1) may be sufficient.

The polymerizable compound (a1) is the hole transport or electron transport and phosphorescent compound, and the polymerizable compound (b) is capable of transporting the oppositely charged carrier. Specifically, <1> When the polymerizable compound (a1) has the hole transport property as the carrier transport property as well as the phosphorescent property, the polymerizable compound (b) has the electron transport property as the carrier transport property, and <2> when the polymerizable compound (a1) has the electron transport property as the carrier transport property as well as the phosphorescent property, the polymerizable compound (b) has the hole transport property as the carrier transport property. In both cases of <1> and <2>, a polymer compound having all functions of the phosphorescent property, the hole transport property, and the electron transport property can be obtained by merely copolymerizing the two kinds of compounds, respectively. When compared with the conventional polymer compounds using three kinds of compounds having the respective functions, a polymer compound having excellent durability can be obtained, since it suffices to use fewer kinds of compounds used as monomers. Also, adjustment of the energy levels is easier than the conventional ones, since it suffices to select only two kinds of compounds. Further, since the polymerizable compound (a1) has both functions of the carrier transport property and the phosphorescent property, a higher probability of generating excitons on the structural unit derived from the polymerizable compound (a1) and a higher luminous efficiency can be obtained.

In the light-emitting layer [A], a combination of a polymerizable compound represented by the formula (E1-1), in particular by the following formula (E1-1-1) having the hole transport property and the phosphorescent property as the polymerizable compound (a1) and the polymerizable compound (b) having the electron transport property is the most preferable, since a device with excellent luminous efficiency and excellent durability can be obtained.

(E1-1-1)

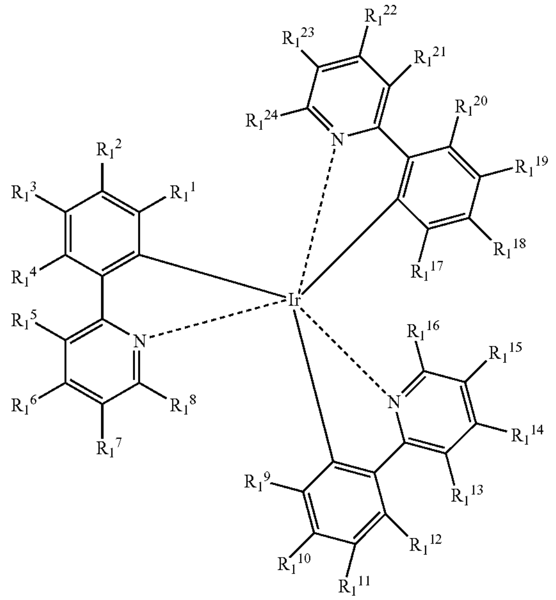

In the formula (E1-1-1), at least one of $R_1^1$ to $R_1^{24}$ represents a substituent selected from the group consisting of a halogen atom, a cyano group, an alkyl group having 1 to 10 carbon atoms, an aryl group having 6 to 10 carbon atoms, an amino group optionally substituted with an alkyl group having 1 to 10 carbon atoms, an alkoxy group having 1 to 10 carbon atoms, and a silyl group. One of $R^1$ to $R_1^{24}$ represents a polymerizable substituent. Such polymerizable substituents have the same meanings as the aforementioned substituents, and so is the preferred range.

Also, in the light-emitting layer [A], as the polymerizable compound (b), a polymerizable compound having the carrier transport property in terms of both the hole transport property and the electron transport property, that is, the polymerizable compound having the properties generally called “bipolar character” may be used. The polymerizable compound having the bipolar character is generally superior in either the hole transport property or the electron transport property, so that when this compound is used, the carrier balance is adjusted in accordance with the carrier transport property of the polymerizable compound (a1).

Examples of such polymerizable compound having the bipolar character include 4,4'-N,N'-dicarbazolebiphenyl (CBP) and the like.

The polymer compound (I) contains preferably 3 to 60 wt %, more preferably 15 to 30 wt %, of the structural unit derived from the polymerizable compound (a1) with respect to the total structural units. Here, the amount of the structural units is a value measured by the ICP elemental analysis and the $^{13}$C-NMR measurement. In the polymer compound (I) used in the present invention, a light-emitting layer with excellent film-formability and excellent durability can be obtained even though it contains larger amount of the structural units derived from the polymerizable compound (a1), since the polymerizable compound (a1) has the specific substituents as mentioned above. Also, the concentration quenching can be suppressed and higher luminous efficiency can be attained.

Also, the molecular weight of the polymer compound (I) is preferably 1,000 to 2,000,000, more preferably 20,000 to 100,000 in terms of the weight-average molecular weight. Here, the weight-average molecular weight is a value measured at 40° C. by the gel-permeation chromatography method (GPC) using tetrahydrofuran as a solvent.

The polymer compound (I) may be any of a random copolymer, a block copolymer, and an alternative copolymer.

Polymerization methods to obtain the polymer compound (I) may be any of radical polymerization, cationic polymerization, anionic polymerization, and addition polymerization, though radical polymerization is preferable. These polymerization methods are disclosed more specifically, for example, in Japanese Patent Laid-Open Publication No. 2003-342325, Japanese Patent Laid-Open Publication No. 2003-119179, Japanese Patent Laid-Open Publication No. 2003-113246, Japanese Patent Laid-Open Publication No. 2003-206320, Japanese Patent Laid-Open Publication No. 2003-147021, Japanese Patent Laid-Open Publication No. 2003-171391, Japanese Patent Laid-Open Publication No. 2004-346312, Japanese Patent Laid-Open Publication No. 2005-97589, and the like.

As the methods to prepare the light-emitting layer [A], they are not particularly restricted, but for example it may be prepared by the following method. First, a solution dissolving the polymer compound (I) is prepared. The solvents for the preparation of the solution are not particularly restricted, and include, for example, chlorine-containing solvents such as chloroform, methylene chloride, dichloroethane and the like, ether solvents such as tetrahydrofuran, anisole and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like. Then, the prepared solution is coated on a substrate by wet-coating methods such as spin-coating, casting, microgravure coating, gravure coating, bar coating, roll coating, wire bar coating, dip coating, spray coating, screen printing, flexo printing, offset printing, ink jet printing and the like. Depending on the compound to be used and the film-forming conditions, for example, in the case of spin coating or dip coating, the solution contains preferably the polymer compound (I) in an amount of 0.5 to 5 wt %.

<Light-Emitting Layer [B]>

The light-emitting layer [B] contains the compound (a2) and the polymer compound (II) having a structural unit derived from the polymerizable compound (b). The polymer compound (II) is obtained by polymerizing the polymerizable compound (b).

The compound (a2) has one carrier transport property either of a hole transport property or an electron transport property and a phosphorescent property, and is selected from the group consisting of the formulae (E2-1) to (E2-39). That is, the compound (a2) is a hole transport or electron transport and phosphorescent compound. The compound (a2) may be used solely or in a combination of two kinds or more so long as they have the same kind of the carrier transport property.

In the formula (E2-1), at least one of the hydrogen atoms is a substituent selected from the group consisting of a halogen atom, a cyano group, an alkyl group having 1 to 10 carbon atoms, an aryl group having 6 to 10 carbon atoms, an amino group optionally substituted with an alkyl group having 1 to 10 carbon atoms, an alkoxy group having 1 to 10 carbon atoms, and a silyl group. Preferable substituents are the same as those in the formula (E1-1).

These substitutions apply to the hydrogen atoms in the formulae (E2-2) to (E2-39).

The polymerizable compound (b) has one carrier transport property either of a hole transport property or an electron transport property. That is, the polymerizable compound (b) is a hole transport or electron transport compound. The polymerizable compound (b) is not particularly restricted except that it contains a polymerizable substituent, and a publicly known compound having the carrier transport property can be used. The polymerizable compound (b) may be used solely or in a combination of two kinds or more so long as they have the same kind of the carrier transport property.

The aforementioned polymerizable substituents have the same meanings as the polymerizable substituents in the polymerizable compound represented by the formula (E1-1), and so is the preferred range.

As the polymerizable compound (b) having the hole transport property, a compound represented by the formulae (F1) to (F9) is preferably used, and as the polymerizable compound (b) having the electron transport property, a compound represented by the formulae (G1) to (G9) is preferably used. While a polymerizable substituent is represented by the formula (A1) in the formulae (F1) to (F9) and (G1) to (G9), a polymerizable substituent represented by the formula (H1) may be sufficient.

Also, the molecular weight of the polymer compound (II) is preferably 1,000 to 2,000,000, more preferably 20,000 to 100,000 in terms of the weight-average molecular weight. Here, the weight-average molecular weight is a value measured at 40° C. by the gel-permeation chromatography method (GPC) using tetrahydrofuran as a solvent.

The polymerization methods to obtain the polymer compound (II) may be any of radical polymerization, cationic polymerization, anionic polymerization, and addition polymerization, though radical polymerization is preferable. These polymer compounds can be obtained by publicly known methods.

The compound (a2) is the hole transport or electron transport and phosphorescent compound, and the polymerizable compound (b) is capable of transporting the oppositely charged carrier. Specifically, <1> When the compound (a2) has the hole transport property as the carrier transport property as well as the phosphorescent property, the polymerizable compound (b) has the electron transport property as the carrier transport property, and <2> when the compound (a2) has the electron transport property as the carrier transport property as well as the phosphorescent property, the polymerizable compound (b) has the hole transport property as the carrier transport property. In both cases of <1> and <2>, a light-emitting layer having all functions of the phosphorescent property, the hole transport property, and the electron transport property can be obtained by using only two kinds of compounds, respectively. Because of this, it has excellent durability. When compared with the conventional methods, adjustment of the energy levels is easier, since it suffices to select only two kinds of compounds. Further, since the compound (a2) has both the carrier transport property and the phosphorescent property, a higher probability of generating excitons on the compound (a2) and a higher luminous efficiency can be obtained.

In the light-emitting layer [B], a combination of a compound represented by the formula (E2-1), in particular, by the following formula (E2-1-1) having the hole transport property and the phosphorescent property as the compound (a2) and the polymer compound (II) containing a structural unit derived from the polymerizable compound (b) having the electron transport property is the most preferable, since a device with excellent luminous efficiency and excellent durability can be obtained.

(E2-1-1)

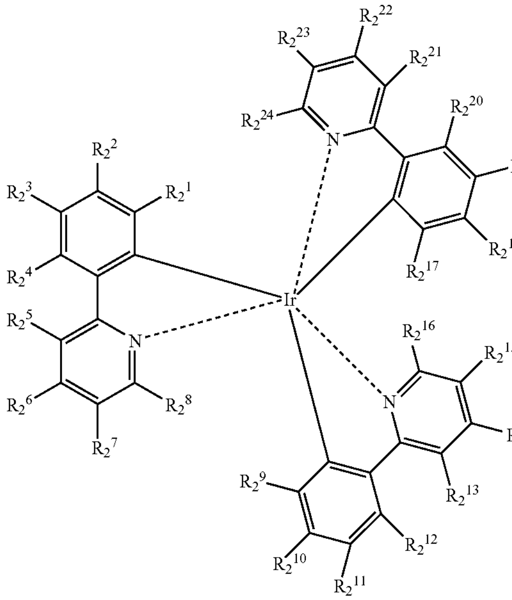

In the formula (E2-1-1), at least one of $R_2^1$ to $R_2^{24}$ represents a substituent selected from the group consisting of a halogen atom, a cyano group, an alkyl group having 1 to 10 carbon atoms, an aryl group having 6 to 10 carbon atoms, an amino group optionally substituted with an alkyl group having 1 to 10 carbon atoms, an alkoxy group having 1 to 10 carbon atoms, and a silyl group.

Also, in the light-emitting layer [B], as the polymerizable compound (b), a polymerizable compound having the carrier transport property in terms of both the hole transport property and the electron transport property, that is, the polymerizable compound having the property generally called "bipolar character" may be used. The polymerizable compound having the bipolar character is generally superior in either the hole transport property or the electron transport property, so that when this compound is used, the carrier balance is adjusted in accordance with the carrier transport property of the compound (a2).

Examples of such polymerizable compound having the bipolar character include 4,4'-N,N'-dicarbazolebiphenyl (CBP) and the like.

The light-emitting layer [B] contains preferably 3 to 60 wt %, more preferably 15 to 30 wt %, of the compound (a2) with respect to the total amount of the compound (a2) and the polymer compound (II). Because the compound (a2) used in the present invention has the specific substituent as mentioned above, it has excellent film-formability and especially excellent dispersibility, thus it can be used in high concentration. Also, the compound (a2) has excellent dispersibility, so that a light-emitting layer with excellent durability can be obtained. Furthermore, it can suppress the concentration quenching and attain higher luminous efficiency.

As the methods to prepare the light-emitting layer [B], they are not particularly restricted, and for example, it may be prepared by the following method. First, a solution dissolving the compound (a2) and the polymer compound (II) is prepared. The solvents used for the preparation of the solution are not particularly restricted, and the same solvents used in the case of the light-emitting layer [A] are used. Then, the prepared solution is coated on a substrate by the similar way as in the case of the light-emitting layer [A]. For example, depending on the compound used and film-forming conditions, in the cases of spin coating and dip coating, the solution contains solid components in the concentration of 0.5 to 5 wt %, and preferably the compound (a2) in an amount of 15 to 30 wt % and the polymer compound (II) in an amount of 85 to 70 wt % with respect to the total solid components.

<Light-Emitting Layer [C]>

The light-emitting layer [C] preferably contains the compound (d) having the phosphorescent property that emits light at lower energy than the polymerizable compound (a1).

In this case, the polymer compound (I) is used as a host. Because the polymer compound (I) is superior in durability and the carrier transport property, the energy transfer to the compound (d) takes place efficiently and the compound (d) emits light at high efficiency.

As the compound (d), any compound can be used without restriction so far as it emits light at lower energy than the polymerizable compound (a1). The compound (d) may be used solely or in a combination of two kinds or more. For example, when a compound that emits blue light is used as the polymerizable compound (a1), the compound (d) that emits green, yellow, or red light may be used, and when a compound that emits green light is used as the polymerizable compound (a1), the compound (d) that emits yellow or red light may be used, and when a compound that emits yellow light is used as the polymerizable compound (a1), the compound (d) that emits red light may be used. Here, the energy at which a compound emits light refers to the excitation energy that is determined based on the absorption wavelength or emission wavelength measured by a spectrophotometer.

The light-emitting layer [C] contains preferably 99.5 to 80 wt % of the polymer compound (I) and 0.5 to 20 wt % of the compound (d) with respect to the total amount of the polymer compound (I) and the compound (d).

As the methods to prepare the light-emitting layer [C], they are not particularly restricted, and for example, it may be prepared by the following method. First, a solution dissolving the polymer compound (I) and the compound (d) is prepared. The solvents used for the preparation of the solution are not particularly restricted, and the same solvents used in the case of the light-emitting layer [A] are used. Then, the prepared solution is coated on a substrate by the similar way as in the case of the light-emitting layer [A]. For example, depending on the compound used and the film-forming conditions, in the case of spin coating or dip coating, the solution contains solid components in the concentration of 0.5 to 5 wt %, preferably the polymer compound (I) in an amount of 99.5 to 80 wt % and the compound (d) in an amount of 0.5 to 20 wt % with respect to the total solid components.

<Light-Emitting Layer [D]>

The light-emitting layer [D] preferably contains the compound (d) having the phosphorescent property that emits light at a lower energy than the compound (a2).

In this case, the compound (a2) and the polymer compound (II) are used as hosts. Because a light-emitting layer comprising the compound (a2) and the polymer compound (II) is superior in durability and the carrier transport property, the energy transfer to the compound (d) takes place efficiently and the compound (d) emits light at high efficiency.

As the compound (d), as in the case of the light-emitting layer [C], any compound that emits light at lower energy than the compound (a2) can be used without restriction. The compound (d) may be used solely or in a combination of two kinds or more.

The light-emitting layer [D] contains preferably 15 to 30 wt % of the compound (a2), 70 to 85 wt % of the polymer compound (II), and 0.5 to 20 wt % of the compound (d) with respect to the total amount of the compound (a2), the polymer compound (II), and the compound (d).

As the methods to prepare the light-emitting layer [D], they are not particularly restricted, and for example, it may be prepared by the following method. First, a solution dissolving the compound (a2), the polymer compound (II), and the compound (d) is prepared. The solvents used for the preparation of the solution are not particularly restricted, and the same solvents used in the case of the light-emitting layer [A] are used. Then, the prepared solution is coated on a substrate by the similar way as in the case of the light-emitting layer [A]. For example, depending on the compound used and the film-forming conditions, in the case of spin coating or dip coating, the solution contains solid components in the concentration of 0.5 to 5 wt %, preferably the compound (a2) in an amount of 15 to 30 wt %, the polymer compound (II) in an amount of 70 to 85 wt %, and the compound (d) in an amount of 0.5 to 20 wt % with respect to the total solid components.

3. Other Layers

In the following, other layers that may be used for the light-emitting device of the present invention are described.

<Anode Buffer Layer: when BAYTRON and the Like are Used>

As a compound used for the anode buffer layer, any compound may be used without particular restriction so far as it has good adhesiveness to an anode surface and its overlying layers, and there may be mentioned, for example, publicly known conductive polymers, such as a mixture of poly(ethylenedioxythiophene) (PEDOT) and poly(styrenesulfonic acid) (PSS), a mixture (PANI) of polyaniline and poly(styrenesulfonate salts) and the like. Organic solvents such as toluene, isopropyl alcohol, and the like may be added to these conductive polymers. Also, conductive polymers may contain the third components such as surfactants. As the surfactants, there may be mentioned, for example, surfactants that contain alkyl groups, alkylaryl groups, fluoroalkyl groups, alkylsiloxane groups, sulfate salts, sulfonate salts, carboxylates, amides, betaine structures, quaternary ammonium group and the like, and fluoride-based nonionic surfactants may be also used.

<Hole Block Layer>

Also, for the purpose of preventing a hole from permeating through the light-emitting layer and efficiently recombining a hole and an electron within the light-emitting layer, a hole block layer may be provided adjacent to the cathode side of the light-emitting layer. In this hole block layer, a compound with a lower Highest Occupied Molecular Orbital (HOMO) level than a light-emitting compound is used, and specifically, examples of such compounds include triazole derivatives, oxadiazole derivatives, phenanthroline derivatives, aluminum complexes and the like.

Further, in order to prevent excitons from being deactivated by the cathode metals, an exciton block layer may be provided adjacent to the cathode side of the light-emitting layer. In this exciton blocking layer, a compound having an energy of the excited triplet state higher than that of the light-emitting compounds is used, and specifically, examples of such compounds include triazole derivatives, phenanthroline derivatives, aluminum complexes and the like.

<Methods for Forming Each Layer>

The aforementioned layers may be formed by the dry-film forming methods, such as resistance heating vapor deposition, electron beam vapor deposition, sputtering and the like, and also by the wet-film forming methods, such as spin-coating, casting, microgravure coating, gravure coating, bar coating, roll coating, wire bar coating, dip coating, spray coating, screen printing, flexo printing, offset printing, and ink jet printing and the like. In the case of low molecular weight compounds, dry-film forming methods are preferably used, and in the case of high molecular weight compounds, wet-film forming methods are preferably used.

<Anode>

As the anode materials relating to the organic light-emitting device of the present invention, when observing the light emission through a substrate, for example, publicly known transparent conductive materials such as ITO (indium tin oxide), tin oxides, zinc oxides, and conductive polymers such as polythiophenes, polypyrroles, polyanilines and the like are preferably used. Also, a thin metal film having a thickness of 1 to 3 nm may be provided on the ITO surface without impairing the optical transparency. Examples of such metals include gold, nickel, manganese, iridium, molybdenum, palladium, platinum and the like.

Also, when observing the light emission through the upper electrode (top emission), transparency of the anode is not necessary. Therefore, as these anode materials, for example, metals or metal compounds having the work function higher than 4.1 eV are preferably used, and metals similar to the aforementioned metals are specifically used. These metals may be used solely or in a combination of two kinds or more.

The surface resistance of the anode is preferably 1 to 50Ω/□ (ohms/square), and the thickness of the anode is preferably 2 to 300 nm.

The film-forming methods for the anode include, for example, vacuum vapor deposition, electron beam vapor deposition, sputtering, chemical reaction, coating methods and the like.

<Surface Treatment of the Anode>

Also, at the time of film-forming of the anode buffer layer and the like, the properties of the anode buffer layer and the like (adhesiveness to the anode substrate, surface smoothness, lowering of the hole injection barrier and the like) are improved by pre-treatment of the anode surface. Examples of such pre-treatments include high-frequency plasma treatment, and such treatments as sputtering, corona treatment, UV ozone irradiation, oxygen plasma treatment and the like.

<Cathode>

As the cathode materials relating to the organic light-emitting device of the present invention, materials are not specially restricted so long as they have low work function and are chemically stable. For example, alkali metals such as Li, Na, K, Cs and the like; alkaline earth metals such as Mg, Ca, Ba and the like; Al; MgAg alloys; alloys of Al and alkali metals such as AlLi, AlCa and the like are preferably used. In view of the chemical stability, materials having the work function of 2.9 eV or lower are preferred. The thickness of the cathode is preferably 10 nm to 1 μm, and more preferably 50 to 500 nm.

As the film-forming methods for the cathode materials, for example, such methods as resistant heating vapor deposition, electron beam vapor deposition, sputtering, ion plating and the like are used.

Also, for the purpose of lowering the electron injection barrier from the cathode to the organic layer, and thus increasing the efficiency of the electron injection, a cathode buffer layer may be provided. As this cathode buffer layer, a layer of metals having lower work function than the cathode is used, and is inserted between the cathode and the organic layer adjacent to the cathode. As the metals used for the cathode buffer layer, there may be mentioned, for example, alkali metals (Na, K, Rb, Cs), alkaline earth metals (Sr, Ba, Ca, Mg), rare earth metals (Pr, Sm, Eu, Yb) and the like. Also, alloys and metal compounds may be used so long as their work function is lower than that of the cathode. The thickness of the cathode buffer layer is preferably 0.05 to 50 nm, more preferably 0.1 to 20 nm, and most preferably 0.5 to 10 nm.

Further, the cathode buffer layer may be formed as a mixture between the metal having low work function and a compound having an electron transport property. As the compound having the electron transport property, the aforementioned compounds shown as examples are used. The thickness of such cathode buffer layer is preferably 0.1 to 100 nm, more preferably 0.5 to 50 nm, and most preferably 1 to 20 nm.

Also, between the cathode and the organic layer, a layer comprising a conductive polymer, a layer comprising a metal oxide, a metal fluoride, an organic insulating material and the like (layer with an average film thickness of 2 nm or less) may be provided.

As the film-forming methods of the cathode buffer layer, such methods as vapor deposition, vapor co-deposition, sputtering and the like are used. Also, depending on the materials used, such film-forming methods as spin coating, dip coating, ink jet coating, printing, spraying, dispenser and the like are used.

<Substrate>

As the substrate relating to the organic light-emitting device of the present invention, an insulating substrate that is transparent to the emission wavelength of the aforementioned light-emitting material is preferably used. Specifically, in addition to glass, such transparent plastics as PET (polyethylene terephthalate), polycarbonate and the like are used.

<Sealing>

After the cathode is prepared, in order to protect the organic light-emitting device, a protection layer and/or a protection cover may be provided. In this way, the durability of the organic light-emitting device is improved. As the protection layer, a layer comprising a polymer compound, a metal oxide, a metal fluoride, a metal borate and the like is used. As the protection cover, such materials as a glass plate, a plastic plate whose surface is treated for low water-permeation, a metal and the like are used, and methods for sealing by pasting said cover with the device substrate by using a thermosetting resin, a photo-setting resin and the like are preferably employed.

Also, if a space is maintained by using a spacer, the device becomes resistant to chipping. If inert gases such as nitrogen, argon and the like are filled in this space, oxidation of the cathode can be prevented. Further, if drying agents such as barium oxide and the like are provided in the space, the damage to the device due to moisture adsorbed during manufacturing processes can be suppressed. Among these measures, it is recommended to employ one measure or more.

4. Uses

In order to obtain patterned emission by using the organic light-emitting device of the present invention, such methods that provide a mask having a patterned window on the surface of the above planar light-emitting device, form the organic substance layer of the non-emitting part extremely thick to make substantially non-emitting, and form a patterned anode and/or a cathode are employed. By forming patterns using any of these methods and arranging several electrodes in such a way that enables On/Off independently, a segment-type display device can be obtained. In this way, a display device that can display numbers, letters, simple symbols and the like can be obtained.

Also, in order to form a dot matrix device, both anode and cathode are formed in stripes and arranged orthogonally to each other. By using methods that differently paint a plurality of organic EL compounds having different emitting colors, use a color filter or a fluorescence conversion filter and the like, partial color display or multi-color display may become possible. The dot matrix device may be applied to a passive drive or an active drive in combination with TFT and the like. These display devices may be preferably used as the display devices in computers, televisions, mobile terminals, cell phones, car navigation systems, view finders of video cameras and the like.

In order to obtain a planer emission by using the organic light-emitting device of the present invention, a planar anode and a planar cathode are arranged in such a way to be overlaid. Because these planer light-emitting devices are of the self-emitting thin type, they are preferably used as a surface-emitting light source, a back light for the display devices such as liquid crystal display devices, planar illuminating devices, interiors, and exteriors. Also, if a flexible substrate is used, it can be used as a light source or a display device with curved surfaces.

EXAMPLES

In the following, the present invention will be described with reference to Examples and Comparative Examples in more detail, but the present invention is in no way restricted by these descriptions.

For simplicity, materials and the layers formed therefrom are abbreviated as follows.

ITO: indium tin oxide (anode)

Example 1

On one face of a 25-mm square glass substrate, an organic light-emitting device was prepared by using an ITO. (indium tin oxide)-attached substrate (Nippo Electric Co., Ltd.) on which two lines of ITO electrodes each having a width of 4 mm were provided. Firstly, poly(3,4-ethylenedioxythiophene)/poly(styrenesulfonic acid) (trade name "BAYTRON P", manufactured by Bayer AG) was applied on the ITO (anode) of the ITO-attached substrate by spin coating method at a rotation speed of 3500 rpm and a coating time of 40 seconds, followed by drying at 100° C. for 2 hours under reduced pressure in a vacuum desiccator to form an anode buffer layer. The thickness of the obtained anode buffer layer was about 60 nm.

Then, a coating solution to form a layer that contains the phosphorescent compound was prepared. Namely, 11.5 mg of polydi[4-(3,5-dimethyl-p-terphenyl)]-2,6-dimethyl-4-styrylphenyl borane (abbreviated as poly-(vi2MB)), which is a polymer compound having the electron transport property, and 1.3 mg of tris(4-tert-butylphenylpyridine)iridium (III) (abbreviated as G3), which is a compound (a dye) having the hole transport property and the phosphorescent property were dissolved in 387.2 mg of toluene (guaranteed reagent, Wako Pure Chemical Industries, Ltd.), and then the obtained solution was filtered through a filter with 0.2 μm pour diameter to obtain the coating solution. The dye concentration contained in the coating solution was 10% with respect to the solid components. Then, the prepared coating solution was applied on the anode buffer layer with spin coating method under the conditions of a rotation speed of 3000 rpm and a coating time of 30 seconds, followed by drying at 140° C. for 30 minutes to obtain a light-emitting layer. The thickness of the obtained light-emitting layer was about 80 nm. Then, the substrate on which the light-emitting layer was formed was mounted in a vapor deposition apparatus, vapor-deposited with barium at the vapor deposition speed of 0.01 nm/s up to 2 nm thickness, followed by vapor deposition with aluminum as the cathode at the vapor deposition speed of 1 nm/s up to 150 nm thickness to obtain device 1. Here, the layers of barium and aluminum were formed in 2 lines each with 3 mm width arranged orthogonally with respect to the lengthwise direction of the anode to prepare 4 pieces of organic light-emitting devices with 4 mm long×3 mm wide per one sheet of the glass substrate.

An electric voltage was applied to the organic EL device by using TR6143 (Programmable direct current voltage/current source, Advantest Corporation) thereby emitting the organic EL device. Its luminance brightness was measured using a luminance meter BM-8 (Topcon Corporation). The external quantum efficiency (%) and the durability (time) relative to the initial luminance of 100 cd/$m^2$ of the obtained device are shown in Table 3 (each value is the average of 4 devices formed on one substrate).

As illustrated in Table 1, devices 2 to 4 were prepared in the same way as device 1 except that the concentration of the dye (G3) in the solid components was varied to 20%, 30%, and 40%. The results of the measurements of EL light emitting properties of these devices performed in the same way as device 1 are also shown in Table 3.

Comparative Example 1

As illustrated in Table 2, devices 5 to 8 were prepared in the same way as device 1 except that poly(N,N'-(3-methylphenyl)-N-phenyl-N'-(3-vinylphenyl)-1,1'-biphenyl-4,4'-diamine-Co-di[4-(3,5-dimethyl-p-terphenyl)]-2,6-dimethyl-4-styrylphenyl borane) (poly-(HMTPD)-poly-(vi2MB)) was used in the coating solution instead of the polymer compound having the electron transport property (poly-(vi2MB)) used for device 1. The results of the measurements of EL light emitting properties of these devices performed in the same way as device 1 are also shown in Table 3.

TABLE 1

| Device No. | Polymer compound (electron transport property) Poly-(vi2MB) | Phosphorescent compound (dye) G3 |
|---|---|---|
| 1 | 11.5 mg | 1.3 mg |
| 2 | 10.2 mg | 2.6 mg |
| 3 | 9 mg | 3.8 mg |
| 4 | 7.7 mg | 5.1 mg |

TABLE 2

| Device No. | Polymer compound (hole transport property-electron transport property) Poly-(HMTPD)-poly-(vi2MB) | Phosphorescent compound (dye) G3 |
|---|---|---|
| 5 | 11.5 mg | 1.3 mg |
| 6 | 10.2 mg | 2.6 mg |
| 7 | 9 mg | 3.8 mg |
| 8 | 7.7 mg | 5.1 mg |

TABLE 3

| | Dye concentration | External quantum efficiency (%) | Durability (hour) |
|---|---|---|---|
| Example 1 | | | |
| Device 1 | 10% | 3.0 | 234 |
| Device 2 | 20% | 5.2 | 1650 |
| Device 3 | 30% | 4.0 | 1800 |
| Device 4 | 40% | 3.6 | 2020 |
| Comparable Example 1 | | | |
| Device 5 | 10% | 3.0 | 936 |
| Device 6 | 20% | 2.0 | 1300 |
| Device 7 | 30% | 1.9 | 1500 |
| Device 8 | 40% | 1.5 | 1700 |

As illustrated in Table 3, it is evident that the light-emitting device prepared by adding the phosphorescent compound (dye) to the polymer compound having the electron transport property (Example 1) has higher external quantum efficiency and better durability than the light-emitting device prepared by adding the phosphorescent compound (dye) to the copolymer of the polymerizable compound having the hole transport property and the polymerizable compound having the electron transport property (Comparative Example 1).

Improvement of dispersibility and increase in the dye concentration were achieved in the light-emitting device prepared by adding the phosphorescent compound (dye) to the copolymer of the polymerizable compound having the hole transport property and the polymerizable compound having the electron transport property (Comparative Example 1), since the phosphorescent compound (dye) having the specific substituent was used. However, further, in the present application, as described above, it has been found that the carrier transport property associated with the phosphorescent compound can be utilized. Namely, by realizing a combination of the dye having the carrier transport property either of the hole transport property or the electron transport property and the phosphorescent property (the hole transport property in Example 1) and the polymer compound having the other carrier transport property (the electron transport property in Example 1), the durability was dramatically improved.

Example 2

A coating solution was prepared in which another dye was further added to the coating solution used in Example 1 containing the compound having the electron transport property and the phosphorescent compound (dye). Namely, 170 mg of poly-(vi2MB), 19.2 mg of G3 dye, and 6.7 mg of [6-(4-vinylphenyl)-2,4-hexanedionato]bis[2-(2-pyridyl)benzo thienyl]iridium (III) (abbreviated as R3) were dissolved in 2.9 g of toluene, and the obtained solution was filtered through a filter with the pore diameter of 0.2 μm to obtain the coating solution. The dye concentrations contained in the solution were 20% for G3 and 7% for R3 with respect to the solid components. All procedures other than those for preparing the composition of the coating solution were performed according to Example 1 to obtain device 9.

The results of the measurements of EL light emitting properties of device 9 performed in the same way as device 1 are shown in Table 5.

Comparative Example 2

Instead of the coating solution used for device 9, a solution prepared by dissolving 89.3 mg of (poly-(HMTPD)-poly-(vi2MB)) and 6.7 mg of R3 in 2.9 g of toluene followed by filtration through the filter with a pour diameter of 0.2 μm was used. The dye concentration contained in the solution was 7% for R3 with respect to the solid components. All procedures other than those for preparing the composition of the coating solution were performed according to Example 1 to obtain device 10.

The results of the measurements of EL light emitting properties of device 10 performed in the same way as device 1 are shown in Table 5.

TABLE 4

| Device No. | Compound having carrier transport property | | Phosphorescent compound (Dye) R3 |
|---|---|---|---|
| Device 9 | Poly-(vi2MB) | 70 mg | 6.7 mg |
| | +G3 | 19.2 mg | |
| Device 10 | Poly-(HMTPD)-poly-(vi2MB) | 89.3 mg | 6.7 mg |

TABLE 5

| | External quantum efficiency (%) | Durability (hours) |
|---|---|---|
| Example 2 | | |
| Device 9 | 4.2 | 1600 |
| Comparative Example 2 | | |
| Device 10 | 2.3 | 1200 |

As illustrated in Table 5, it is evident that the light-emitting device (Example 2) prepared by adding further R3 dye having a lower emission energy than G3 dye to the system in which the phosphorescent compound (G3 dye) was added in high concentration to the polymer having the electron transport property, showed higher external quantum efficiency and better durability than the light-emitting device (Comparative Example 2) prepared by adding the phosphorescent compound (R3 dye) to the copolymer of the compound having the hole transport property and the compound having the electron transport property.

The invention claimed is:

1. An organic light-emitting device which contains one or more organic layers sandwiched between an anode and a cathode, wherein at least one of the organic layers is a light-emitting layer comprising a polymer compound (I), the polymer compound (I) comprising structural units derived from a hole transport and phosphorescent polymerizable compound (a1) and structural units derived from an electron transport polymerizable compound (b), the polymerizable compound (a1) being selected from the group consisting of the following formulae (E1-1) to (E1-9) and (E1-13) to (E1-32), and wherein the light-emitting layer includes the polymerizable compound (a1) as the only hole transport compound and the light-emitting layer further comprises a phosphorescent compound (d) which emits light at lower energy than the polymerizable compound (a1):

E1-1

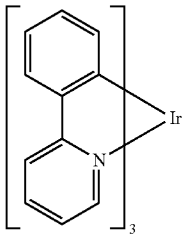

E1-2

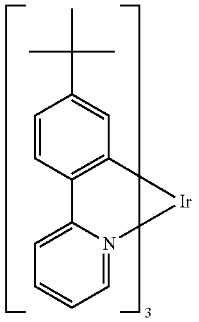

E1-3

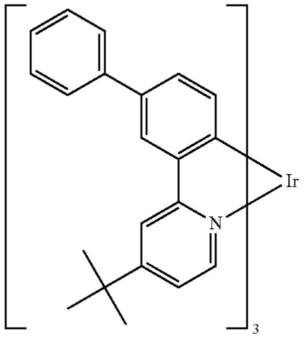

E1-4

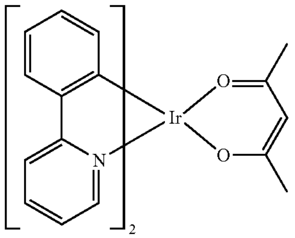

E1-5

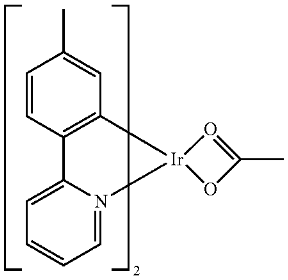

-continued
E1-6
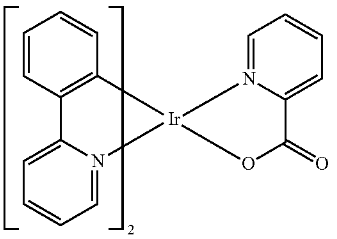
E1-7
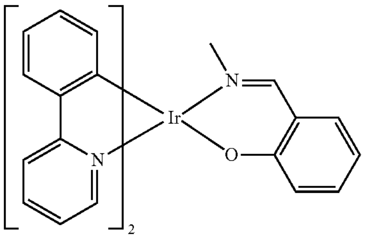
E1-8
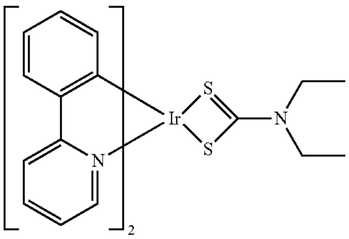
E1-9
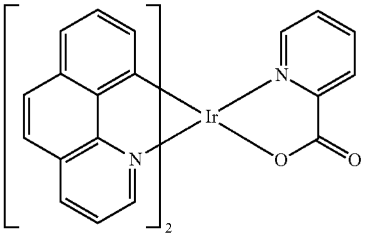
E1-13
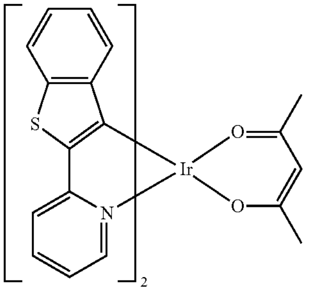
E1-14
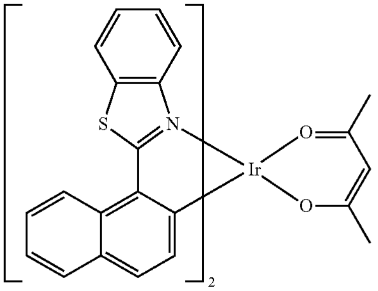
-continued
E1-15
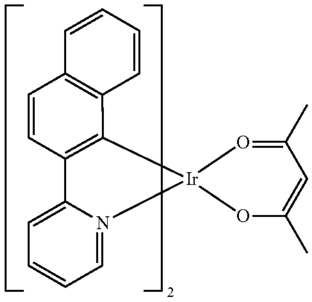
E1-16
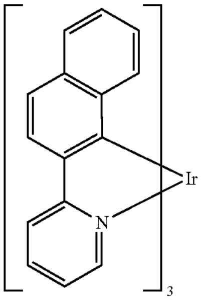
E1-17
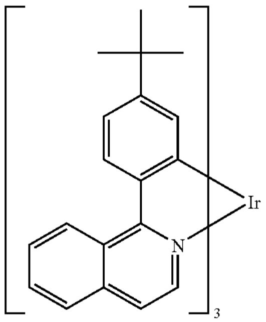
E1-18
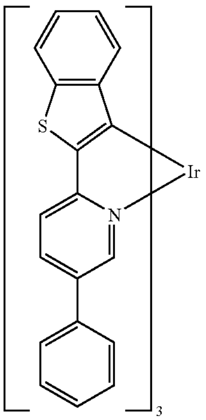

-continued
E1-19
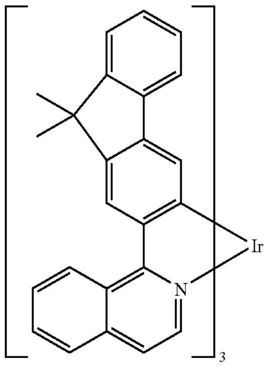
E1-20
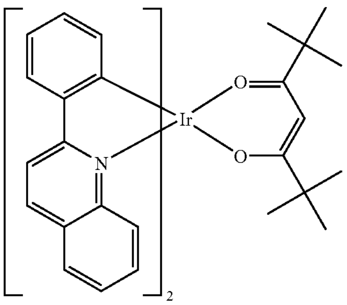
E1-21
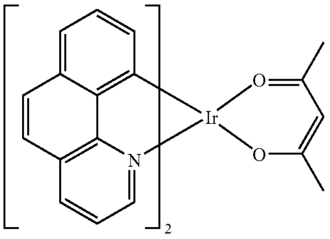
E1-22
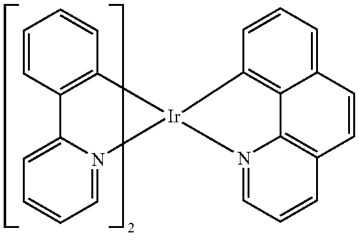
E1-23
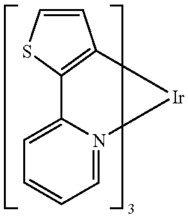
-continued
E1-24
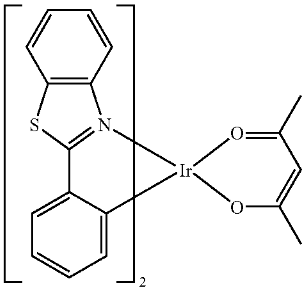
E1-25
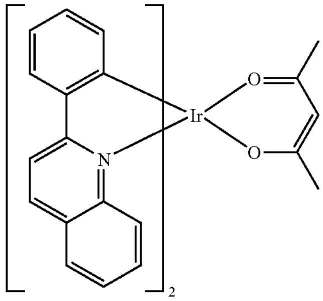
E1-26
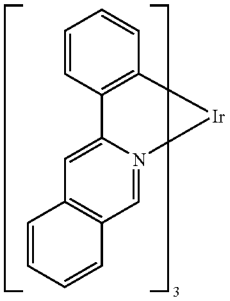
E1-27
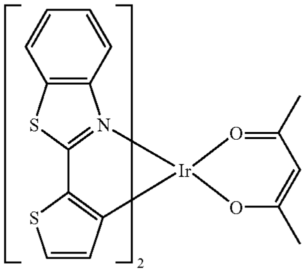
E1-28
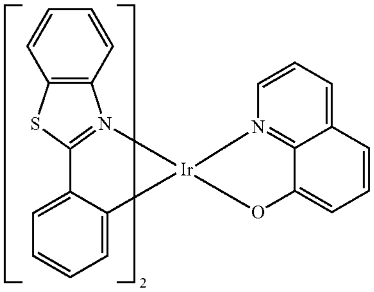

-continued

E1-29

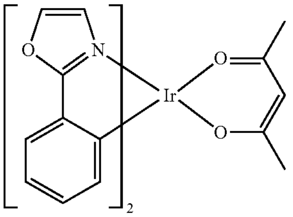

E1-30

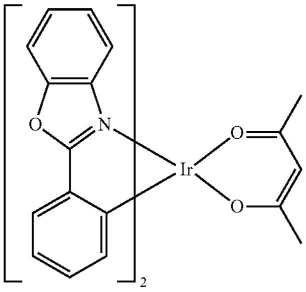

E1-31

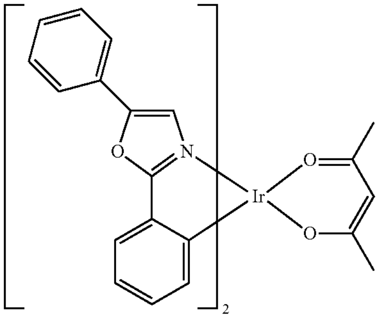

E1-32

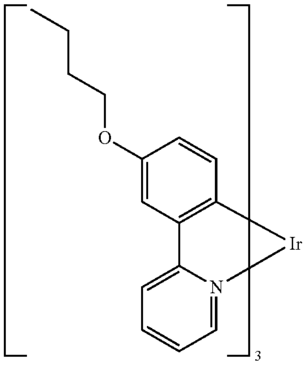

wherein at least one of the hydrogen atoms in the formula (E1-1) is replaced by a substituent selected from the group consisting of an alkyl group having 1 to 10 carbon atoms, an aryl group having 6 to 10 carbon atoms, an amino group optionally substituted with an alkyl group having 1 to 10 carbon atoms, an alkoxy group having 1 to 10 carbon atoms, and a silyl group, and one of the hydrogen atoms is replaced by a polymerizable substituent represented by general formula (H1), (H1)

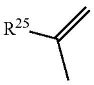

wherein $R^{25}$ represents a hydrogen atom or a linear alkyl group having 1 to 5 carbon atoms; and these substitutions apply to the hydrogen atoms in the formulae (E1-2) to (E1-9) and (E1-13) to (E1-32).

2. The organic light-emitting device according to claim 1, wherein the polymerizable compound (a1) is represented by the formula (E1-1).

3. An organic light-emitting device which contains one or more organic layers sandwiched between an anode and a cathode, wherein at least one layer of the organic layers is a light-emitting layer comprising a compound (a2) being a hole transport and phosphorescent compound and a polymer compound (II) comprising structural units derived from an electron transport polymerizable compound (b), the compound (a2) being selected from the group consisting of the following formulae (E2-1) to (E2-9) and (E2-13) to (E2-32), and wherein the light-emitting layer includes the compound (a2) as the only hole transport compound and the light-emitting layer further comprises a phosphorescent compound (d) which emits light at lower energy than the compound (a2):

E2-1

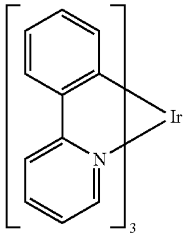

E2-2

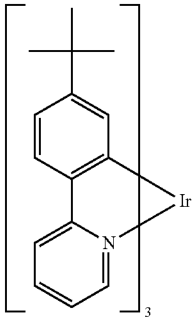

E2-3

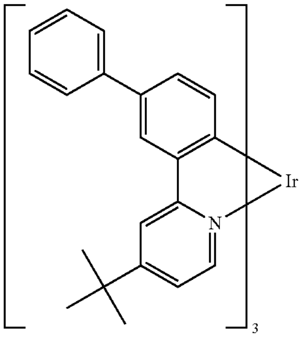

-continued
E2-4
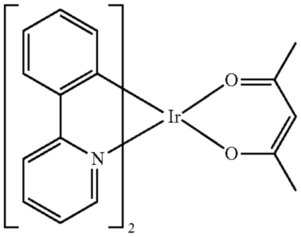
E2-5
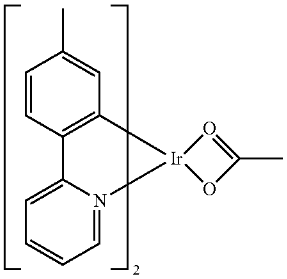
E2-6
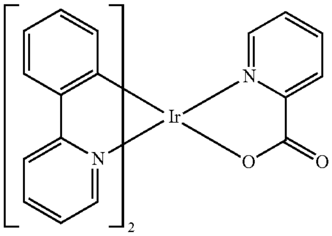
E2-7
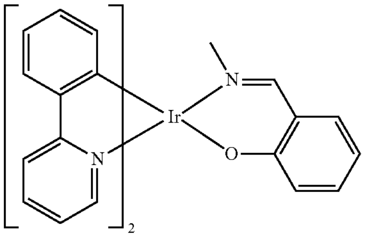
E2-8
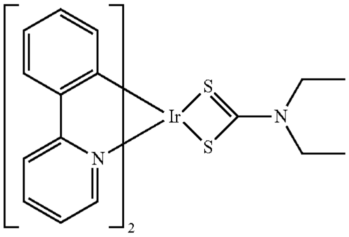
E2-9
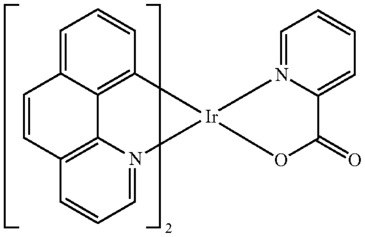
-continued
E2-13
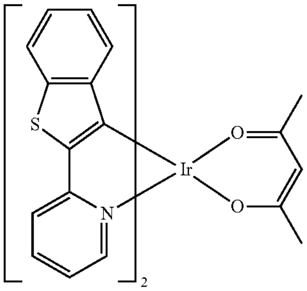
E2-14
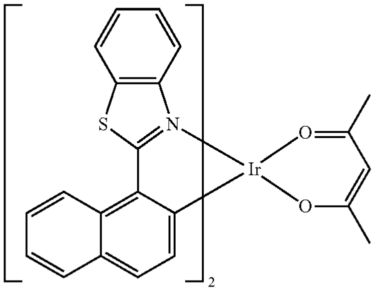
E2-15
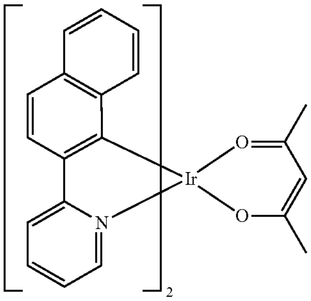
E2-16
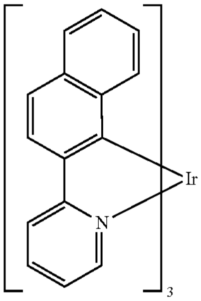
E2-17
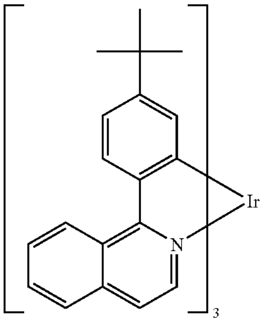

-continued
E2-18
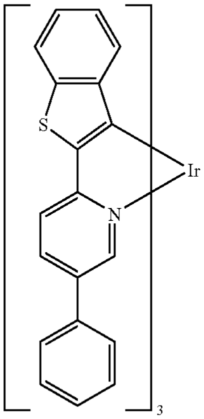
E2-19
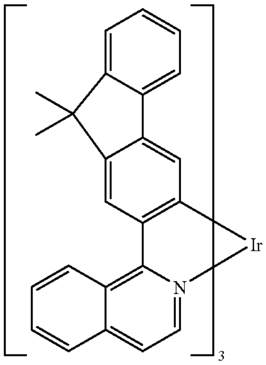
E2-20
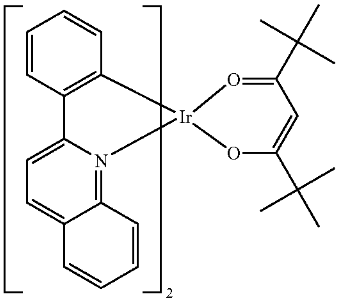
E2-21
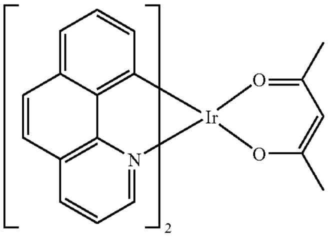
E2-22
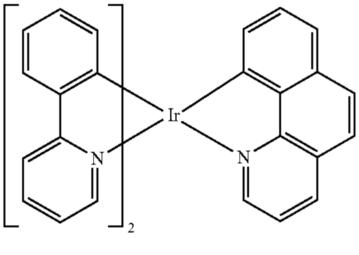
-continued
E2-23
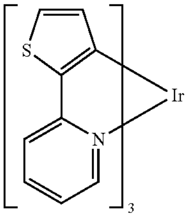
E2-24
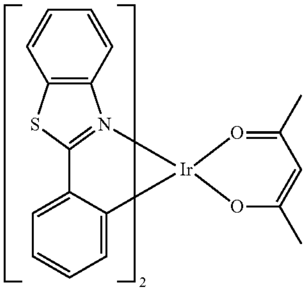
E2-25
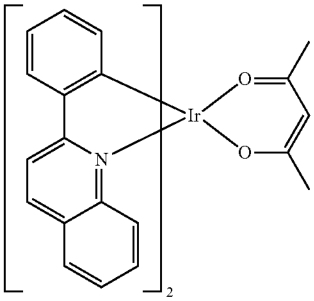
E2-26
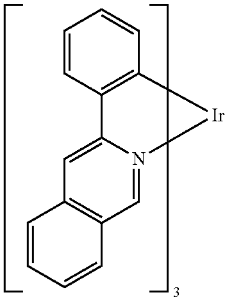
E2-27
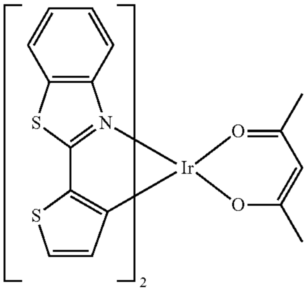

-continued

E2-28

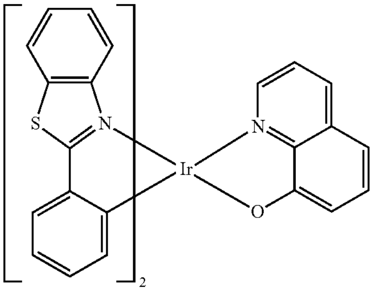

E2-29

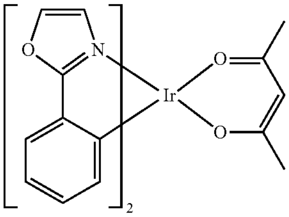

E2-30

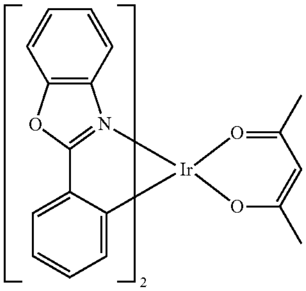

E2-31

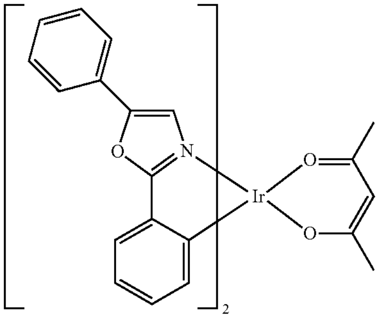

-continued

E2-32

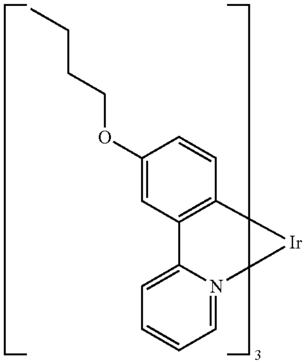

wherein at least one of the hydrogen atoms in the formula (E2-1) is replaced by a substituent selected from the group consisting of an alkyl group having 1 to 10 carbon atoms, an aryl group having 6 to 10 carbon atoms, an amino group optionally substituted with an alkyl group having 1 to 10 carbon atoms, an alkoxy group having 1 to 10 carbon atoms, and a silyl group; and these substitutions apply to the hydrogen atoms in the formulae (E2-2) to (E2-9) and (E2-13) to (E2-32).

4. The organic light-emitting device according to claim 3, wherein the compound (a2) is represented by the formula (E2-1).

5. The organic light-emitting device according to claim 1, wherein the polymer compound (I) contains the structural units derived from the polymerizable compound (a1) in an amount of 15 to 30 wt % based on the total structural units.

6. The organic light-emitting device according to claim 3, wherein the light-emitting layer contains the compound (a2) in an amount of 15 to 30 wt % based on the total amount of the compound (a2) and the polymer compound (II).

7. An image display device, wherein the organic light-emitting device as described in claim 1 is used.

8. An surface-emitting light source, wherein the organic light-emitting device as described in claim 1 is used.

9. A back-light for an image display device, wherein the organic light-emitting device as described in claim 1 is used.

10. An illuminating device, wherein the organic light-emitting device as described in claim 1 is used.

11. An interior, wherein the organic light-emitting device as described in claim 1 is used.

12. An exterior, wherein the organic light-emitting device as described in claim 1 is used.

13. An image display device, wherein the organic light-emitting device as described in claim 3 is used.

14. An surface-emitting light source, wherein the organic light-emitting device as described in claim 3 is used.

15. A back-light for an image display device, wherein the organic light-emitting device as described in claim 3 is used.

16. An illuminating device, wherein the organic light-emitting device as described in claim 3 is used.

17. An interior, wherein the organic light-emitting device as described in claim 3 is used.

18. An exterior, wherein the organic light-emitting device as described in claim 3 is used.

* * * * *